(12) United States Patent
Moribayashi et al.

(10) Patent No.: US 7,504,701 B2
(45) Date of Patent: Mar. 17, 2009

(54) OPTICAL UNIT FEATURING BOTH PHOTOELECTRIC CONVERSION CHIP AND SEMICONDUCTOR CHIP WRAPPED WITH FLEXIBLE SHEET

(75) Inventors: Shigeru Moribayashi, Kanagawa (JP); Yoshiaki Morishita, Kanagawa (JP); Kowashi Taketomi, Kanagawa (JP); Takao Yamazaki, Tokyo (JP); Shinji Watanabe, Tokyo (JP); Ichiro Hatakeyama, Tokyo (JP)

(73) Assignees: NEC Electronics Corporation, Kawasaki, Kanagawa (JP); NEC Corporation, Tokyo (JP)

( * ) Notice: Subject to any disclaimer, the term of this patent is extended or adjusted under 35 U.S.C. 154(b) by 201 days.

(21) Appl. No.: 11/708,142

(22) Filed: Feb. 20, 2007

(65) Prior Publication Data

US 2007/0210400 A1    Sep. 13, 2007

(30) Foreign Application Priority Data

Feb. 20, 2006   (JP) ............................. 2006-042477
Feb. 16, 2007   (JP) ............................. 2007-035698

(51) Int. Cl.
    *H01L 31/00* (2006.01)
(52) U.S. Cl. .................. 257/440; 257/446; 257/461; 385/14; 385/49

(58) Field of Classification Search ................. 257/440, 257/446, 461, 462; 385/14, 49, 94
See application file for complete search history.

(56) References Cited

U.S. PATENT DOCUMENTS

| 2001/0024549 A1* | 9/2001 | Takahashi et al. ............. 385/49 |
| 2001/0026665 A1* | 10/2001 | Ando et al. .................... 385/94 |
| 2004/0264299 A1* | 12/2004 | Cooke et al. ................. 367/149 |
| 2008/0118202 A1* | 5/2008 | Kato et al. .................... 385/14 |

FOREIGN PATENT DOCUMENTS

| JP | 2004-240220 | 8/2004 |
| JP | 2004-253456 | 9/2004 |
| JP | 2005-44966 | 2/2005 |

* cited by examiner

*Primary Examiner*—Phuc T Dang
(74) *Attorney, Agent, or Firm*—McGinn IP Law Group, PLLC

(57) ABSTRACT

In an optical unit including a photoelectric conversion chip adapted to be optically connected to an optical fiber, and a semiconductor chip for driving the photoelectric conversion chip, both the photoelectric conversion chip and the semiconductor chip are wrapped with a flexible sheet, to thereby produce an enveloper enveloping the photoelectric conversion chip and the semiconductor chip therein. At least a part of the enveloper is formed as a transparent area for allowing an optical connection between the optical fiber and the photoelectric conversion chip.

20 Claims, 28 Drawing Sheets

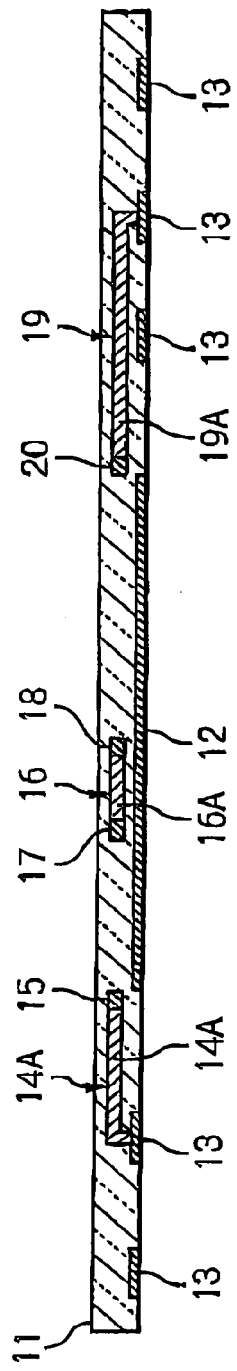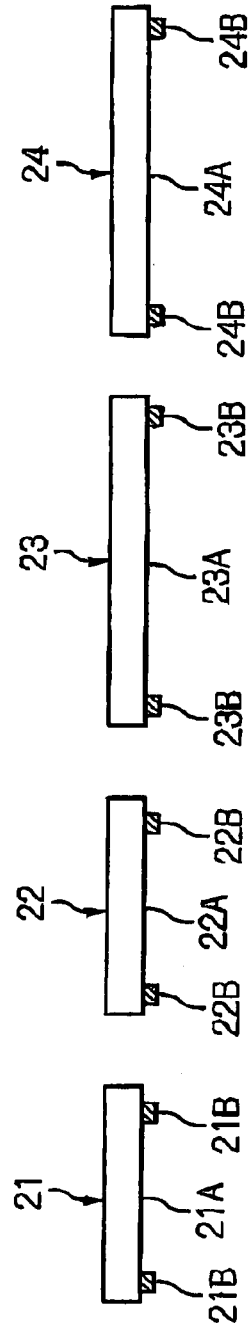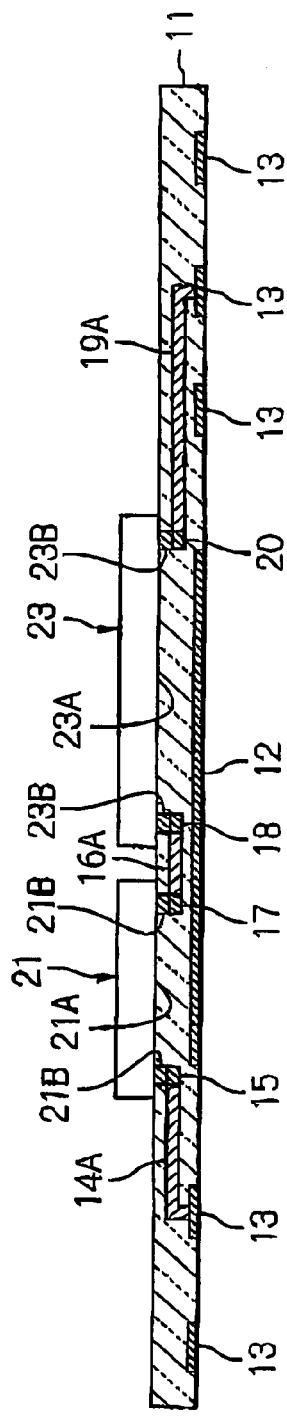

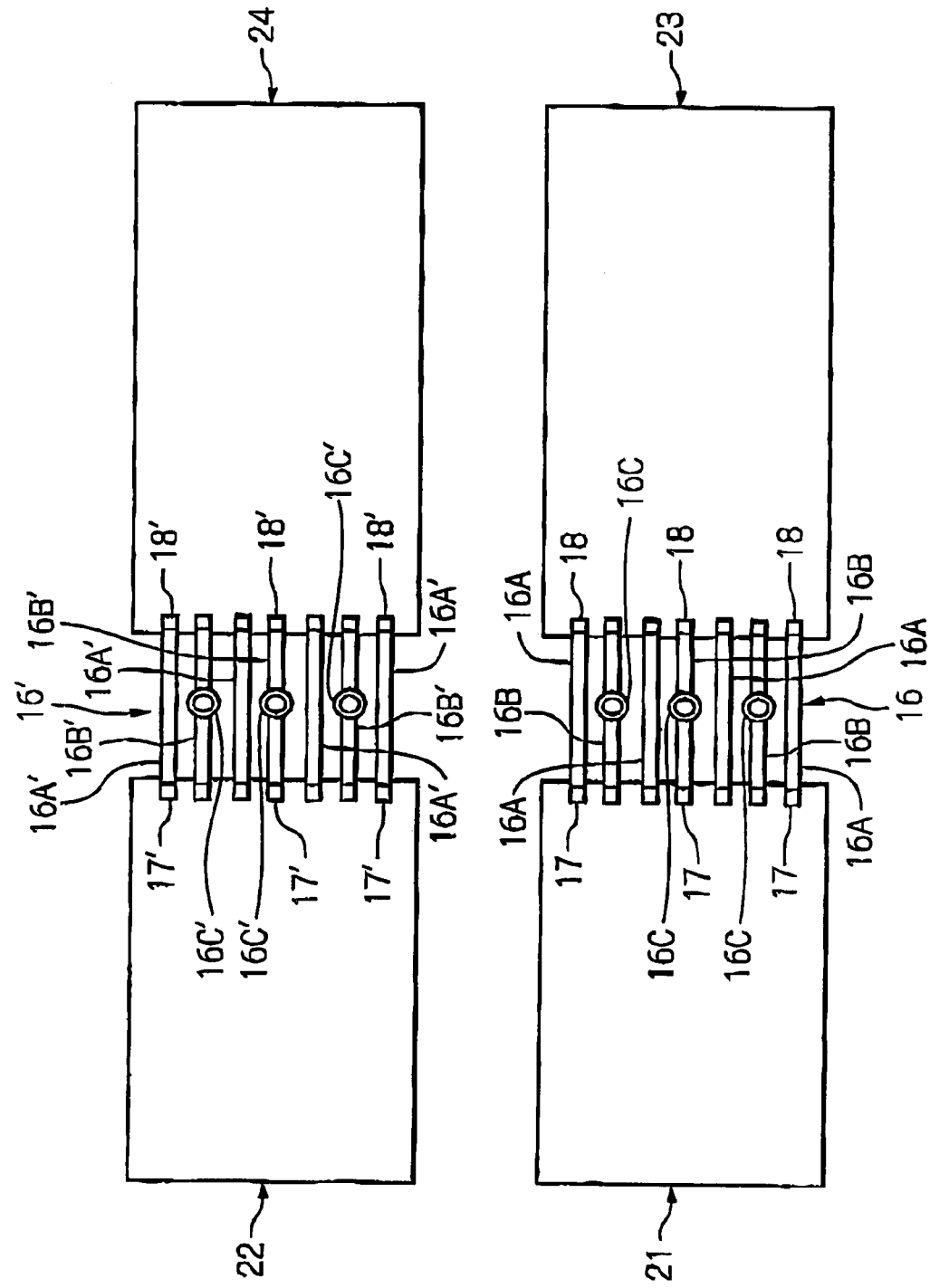

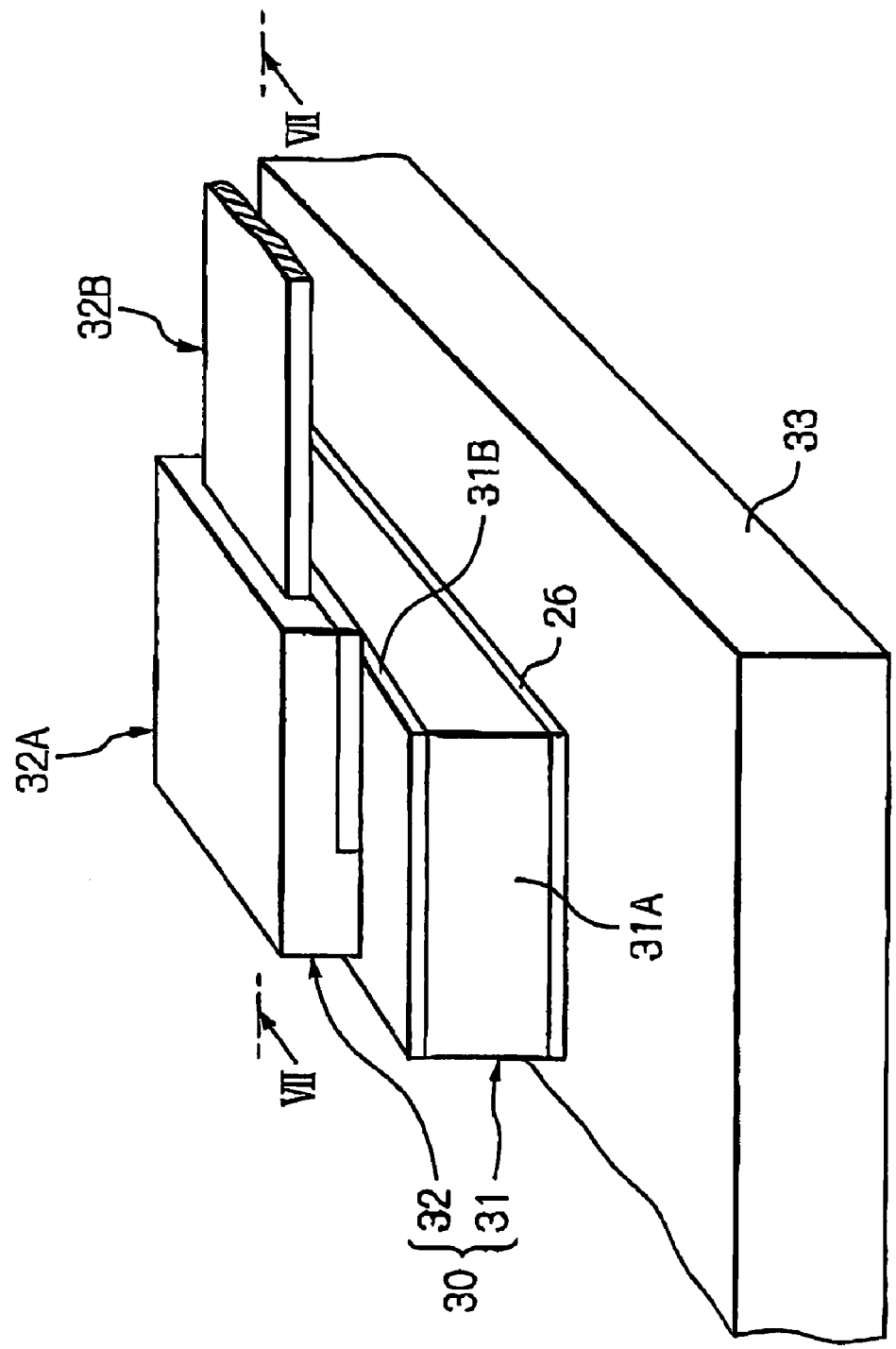

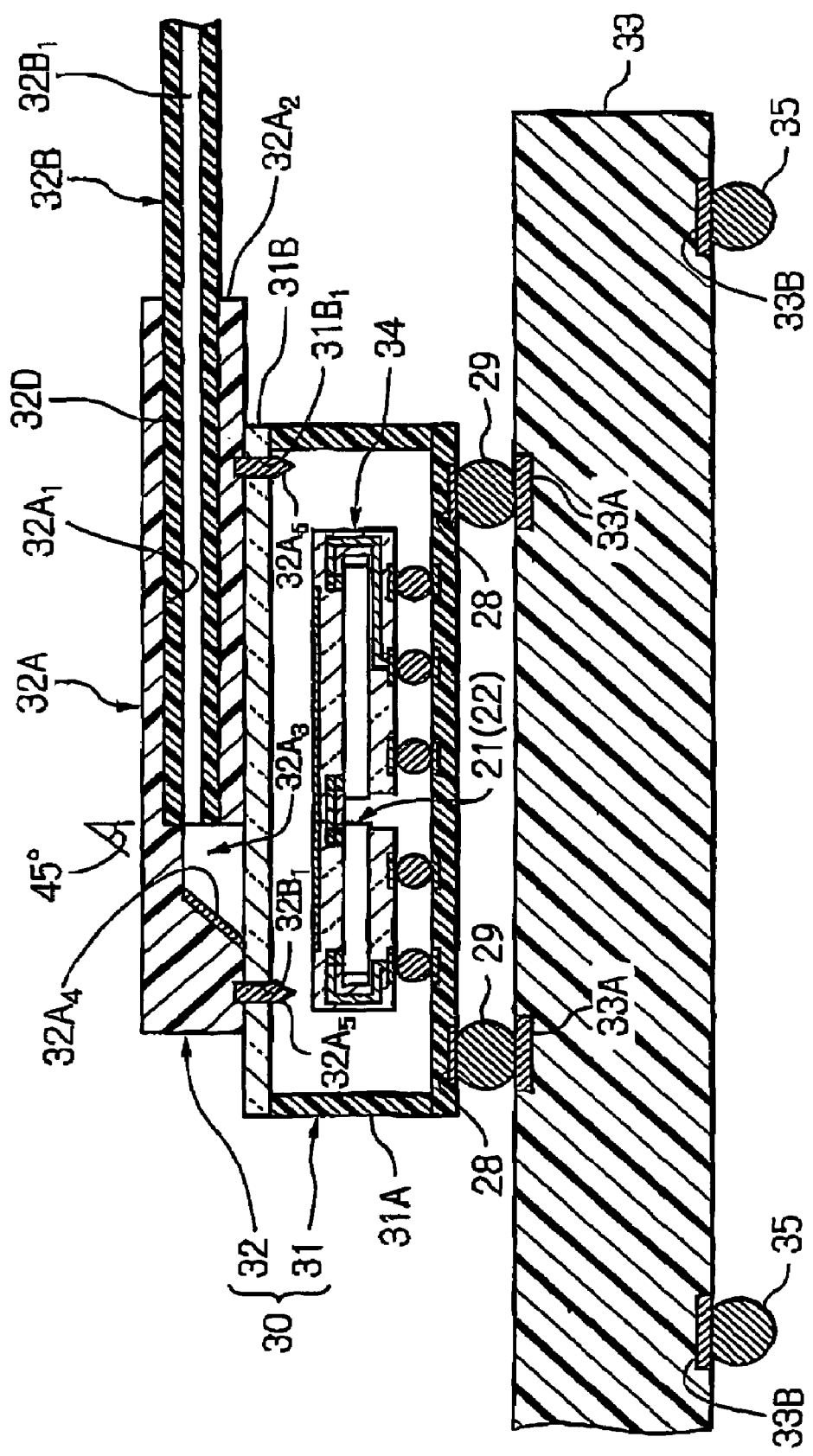

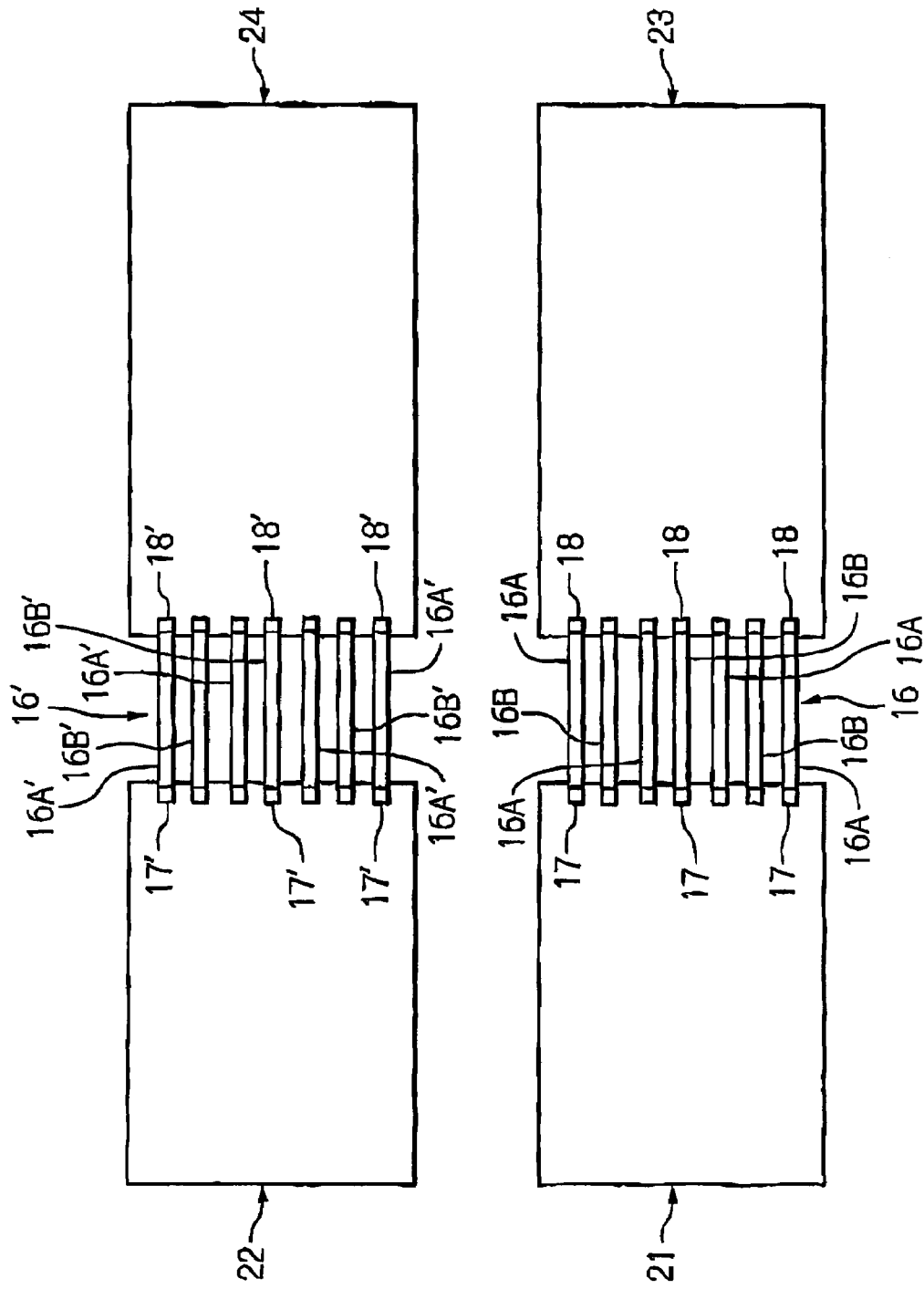

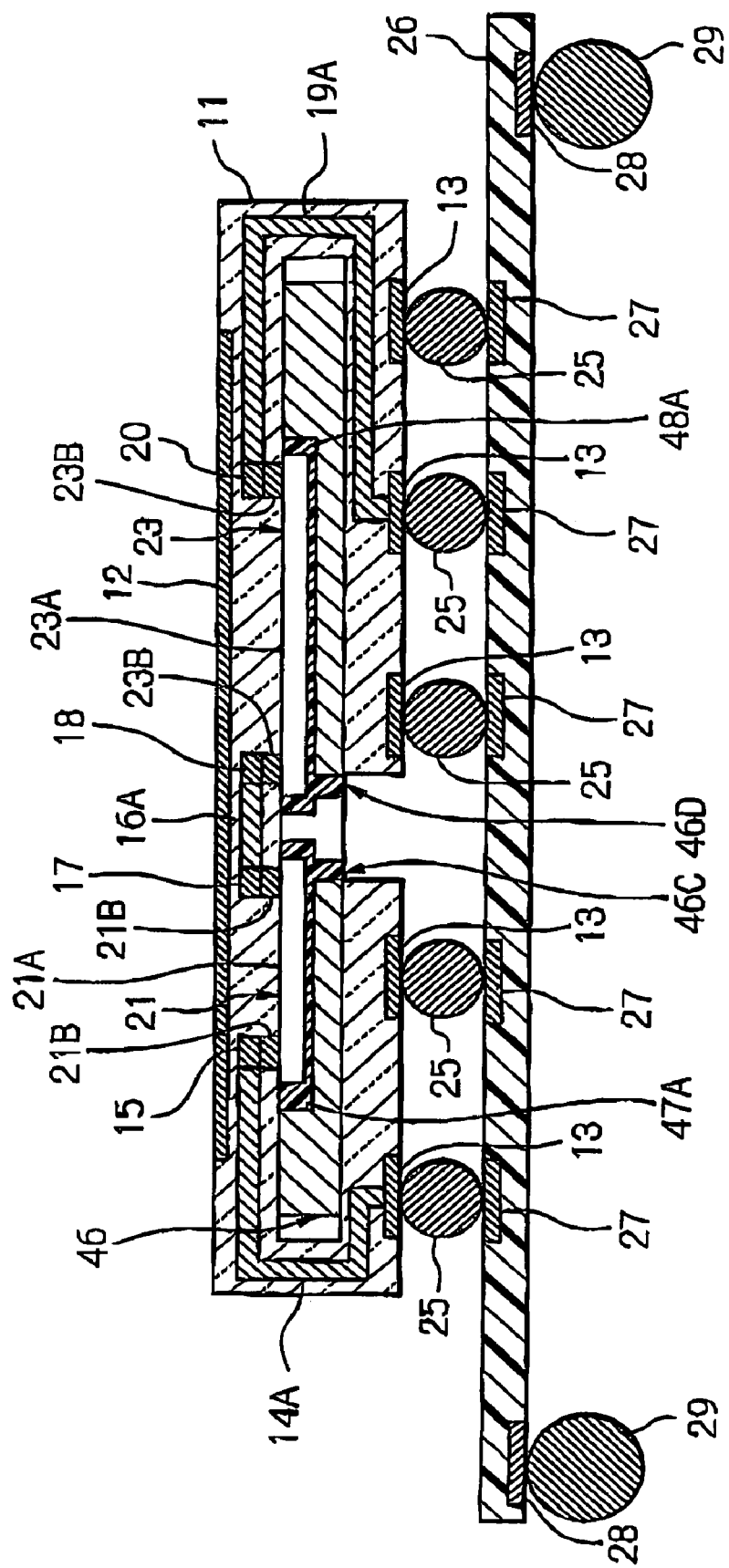

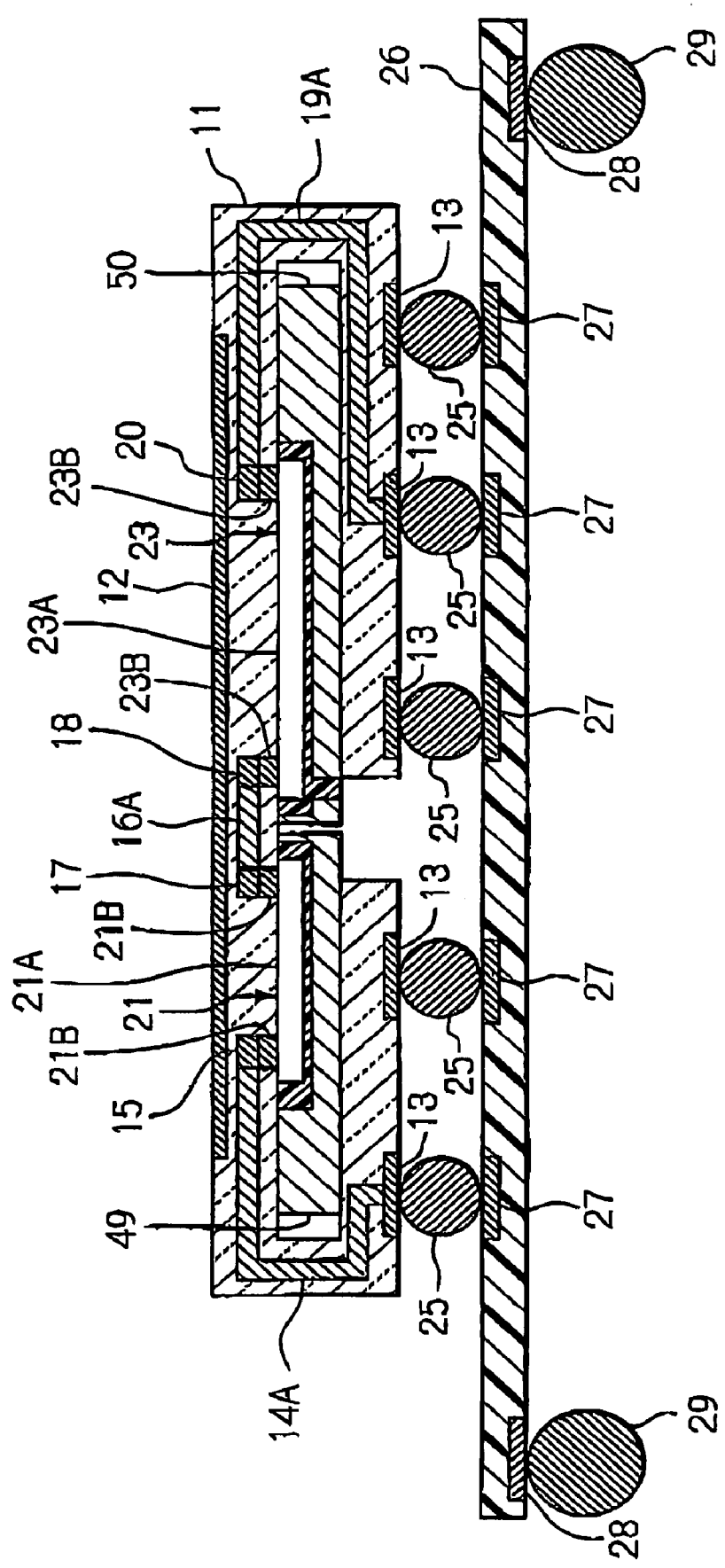

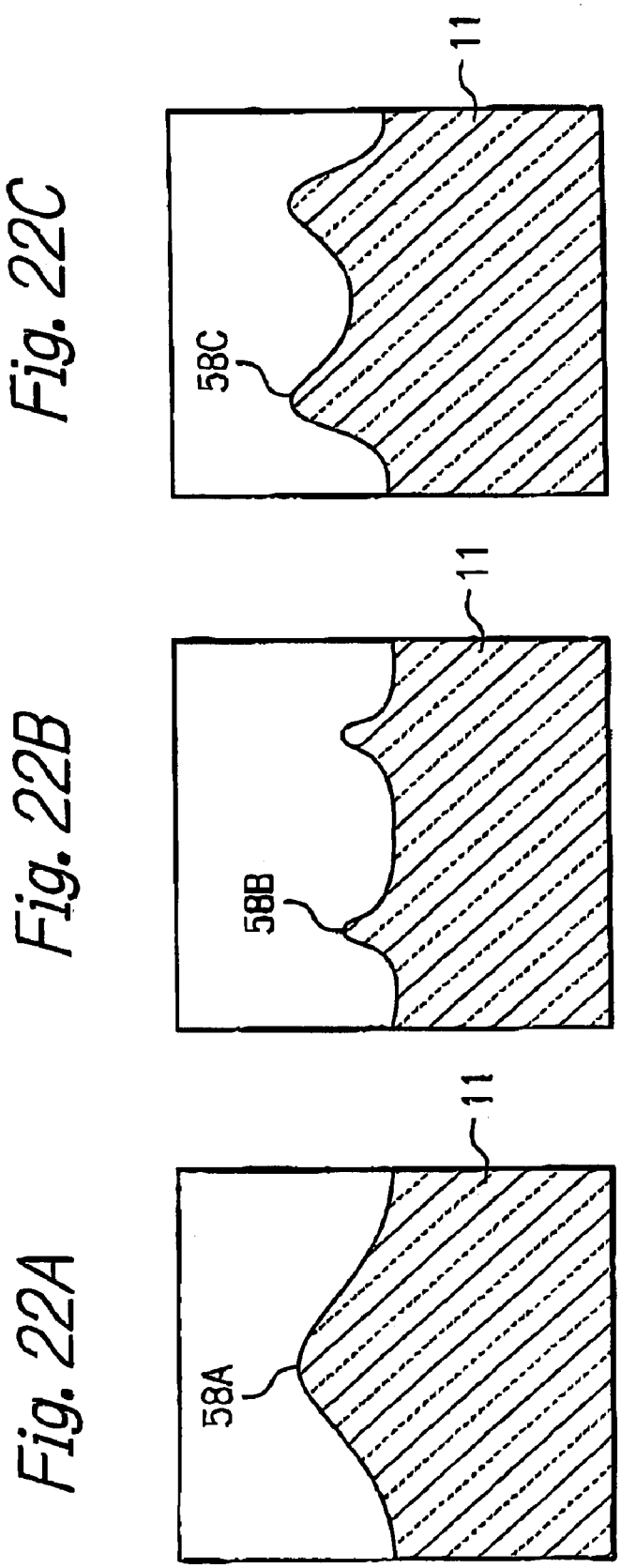

OPTICAL UNIT FEATURING BOTH PHOTOELECTRIC CONVERSION CHIP AND SEMICONDUCTOR CHIP WRAPPED WITH FLEXIBLE SHEET

BACKGROUND OF THE INVENTION

1. Field of the Invention

The present invention relates to an optical module which may be used in an electronic apparatus constructed by high-speed semiconductor processors, and more particularly relates to an optical unit forming such an optical module.

2. Description of the Related Art

Recently, in large scale integrated (LSI) circuits such as semiconductor processors, operation speed has increased more and more. Especially, although it was impossible to operate complementary metal oxide semiconductor (CMOS) processors at 1 GHz ten years ago, 1 GHz CMOS processors have been now put into practice. Further, 10 GHz CMOS processors have been developed.

Under the circumstances, in an electronic apparatus constructed by motherboards, high-speed semiconductor processors provided on the motherboards, and so on, there is a limit in ensuring quality of signals when the semiconductor processors are electrically connected to each other by only electrical interconnection layers formed in the motherboards, and when the motherboards are electrically connected to each other by only electrical cable connectors.

Thus, conventionally, using optical modules in the electronic apparatus has been proposed so that optical interconnection layers are substituted for a part of the electrical interconnection layers, as disclosed in, for example, JP-2004-253456 A, JP-2005-044966 A and P-2004-240220 A.

SUMMARY OF THE INVENTION

It has now been discovered that the above-mentioned prior art optical module has a problem to be solved as will be mentioned in detail hereinbelow.

In accordance with the present invention, there is provided an optical unit including a photoelectric conversion chip adapted to be optically connected to an optical fiber, and a semiconductor chip for driving the photoelectric conversion chip. Both the photoelectric conversion chip and the semiconductor chip are wrapped with a flexible sheet, to thereby produce an enveloper enveloping the photoelectric conversion chip and the semiconductor chip therein. At least a part of the enveloper is formed as a transparent area for allowing an optical connection between the optical fiber and the photoelectric conversion chip.

The flexible sheet may have a first group of interconnection layers for establishing an electrical connection between the photoelectric conversion chip and the semiconductor chip, and a second group of interconnection layers adapted to be electrically connected to an external wiring board.

Preferably, the photoelectric conversion chip and the semiconductor chip are configured as plate-like chips, and the plate-like chips are juxtaposed with each other in the enveloper.

The optical unit may further include a heat sink provided in the enveloper so as to be thermally connected to both the photoelectric conversion chip and the semiconductor chip. The heat sink may be formed as an electrically conductive heat sink. Otherwise, the heat sink may be formed as a non-electrically conductive heat sink. If the heat sink is formed as the electrically conductive heat sink. It may be grounded.

Preferably, the heat sink has first and second cavities formed therein. In this case, the photoelectric conversion chip is received in the first cavity so that a first space is defined therebetween, and the semiconductor chip is received in the second cavity so that a second space is defined therebetween. The first and second spaces may be charged with a gel-state resin having a superior thermal conductivity. The gel-state resin may contain an electrically conductive filler. Otherwise, the gel-state resin may contain a non-electrically conductive filler.

On the other hand, the optical unit may further include a first heat sink provided in the enveloper and having a cavity in which the photoelectric conversion chip is received so that a first space is defined therebetween, and a second heat sink provided in the enveloper and having a cavity in which the semiconductor chip is received so that a second space is defined therebetween. Each of the first and second heat sinks may be formed as an electrically conductive heat sink. Otherwise, each of the first and second heat sinks may be formed as a non-electrically conductive heat sink. If each of the first and second heat sinks is formed as the electrically conductive heat sink, the first and second heat sinks may be grounded.

Preferably, the interconnection layers included in the first group are adjacently arrayed. In this case, one of two adjacent interconnection layers serves as a signal line, and the other one of the two adjacent interconnection layers serves as a ground line.

The enveloper may be a focus lens formed at the transparent area thereof for the optical connection between the optical fiber and the photoelectric conversion chip. Preferably, the focus lens is integrally formed as a part of the enveloper.

A method for manufacturing the aforesaid optical unit comprises the steps of: preparing a photoelectric conversion chip; preparing a semiconductor chip for driving the photoelectric conversion chip; and wrapping both the photoelectric conversion chip and the semiconductor chip, to thereby produce an enveloper enveloping the photoelectric conversion chip and the semiconductor chip therein, at least a part of the enveloper is formed as a transparent area for allowing an optical connection of the photoelectric conversion chip to an optical fiber.

BRIEF DESCRIPTION OF THE DRAWINGS

The present invention will be more clearly understood from the description set forth below, as compared with the prior art optical module, with reference to the accompanying drawings, wherein:

FIGS. 4A through 4F are cross-sectional views for explaining a method for manufacturing a first embodiment of an optical unit according to the present invention;

FIG. 5 is a plan view showing photoelectric conversion chips and semiconductor chips which are extracted from the optical unit of FIG. 4F;

FIG. 6 is a perspective view of an optical module having the optical unit of FIG. 4F;

FIG. 7 is a cross-sectional view taken along the VII-VII line of FIG. 6;

FIG. 11 is a plan view corresponding to FIG. 5, which shows a second embodiment of the optical unit according to the present invention;

FIG. 14 is a cross-sectional view corresponding to FIG. 4F, which shows a fifth embodiment of the optical unit according to the present invention;

FIG. 16 is a cross-sectional view corresponding to FIG. 14, which shows a sixth embodiment of the optical unit according to the present invention;

FIG. 22A is a partial cross-sectional view of the folded flexible transparent sheet of the optical unit of FIG. 20A on which a first focus lens is formed so as to confirm the first type of intensity distribution of FIG. 21A;

FIG. 22B is a partial cross-sectional view of the folded flexible transparent sheet of the optical unit of FIG. 20A on which a second focus lens is formed so as to confirm the second type of intensity distribution of FIG. 21A;

FIG. 22C is a partial cross-sectional view of the folded flexible transparent sheet of the optical unit of FIG. 20A on which a third focus lens is formed so as to confirm the third type of intensity distribution of FIG. 21A;

DESCRIPTION OF THE PREFERRED EMBODIMENTS

Before description of embodiments of the present invention, for better understanding of the present invention, with reference to FIGS. 1A and 1B, FIGS. 2A and 2C and FIGS. 3A and 3B, prior art optical modules will be explained below.

Figure 1A:
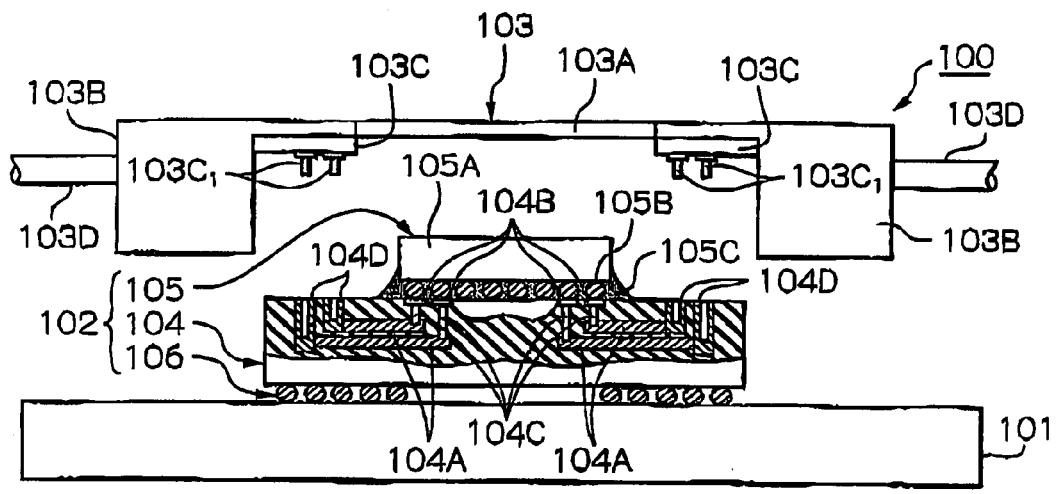
FIG. 1A is an exploded partial cross-sectional elevation view of a first prior art optical module.

Referring to FIG. 1A which is an exploded partial cross-sectional elevation view of a first prior art optical module as disclosed in JP-2004-253456 A, the first prior art optical module is generally indicated by reference numeral 100. The optical module 100 includes a wiring board 101, a flip-chip type ball grid array (BGA) package 102 mounted on the wiring board 101, and a photoelectric conversion unit 103 which is adapted to be detachably attached to the flip-chip type BGA package 102.

Although not shown in FIG. 1A, the wiring board 101 has a plurality of electrical interconnection layers formed therein, and a plurality of electrode pads formed on a top surface of the wiring board 101 so as to be suitably connected to the electrical interconnection layers.

The flip-chip type BGA package 102 includes a package board or interposer 104, a flip-chip type semiconductor device 105 mounted on a top surface of the interposer 104, and a plurality of outer electrode terminals 106 such as solder balls bonded to a bottom surface of the interposer 104.

The interposer 104 has a plurality of electrical interconnection layers formed therein, and a plurality of electrode pads formed on the top surface thereof so as to be suitably connected to the electrical interconnection layers. Note, in FIG. 1A, only four of the electrical interconnection layers are representatively shown and indicated by reference 104A, and only four of the electrode pads are representatively shown and indicated by reference 104B.

One end of each of the electrical interconnection layers 104A is connected to the corresponding electrode pad 104B through the intermediary of a via plug 104C formed in the interposer 104, and the other end thereof is connected to a corresponding electrical jack 104D formed in the interposer 104.

The flip-chip type semiconductor device 105 includes a bare chip 105A, and a plurality of metal bumps 105B bonded to a circuit formation face of the bare chip 105A, and is mounted on the interposer 104 so that the metal bumps 105B are connected to the respective electrode pads 104B formed on the top surface of the interposer 104. The flip-chip type semiconductor device 105 is underfilled with a suitable resin material 105C so that the metal bumps 105B are sealed with the resin material 105C.

The flip-chip type BGA package 102 is mounted on the wiring board 101 so that the outer terminals or solder balls 106 are electrically connected to the electrode pads (not shown) formed on the top surface of the wiring board 101.

The photoelectric conversion unit 103 includes an elongated support member 103A, and two casings 103B provided at the ends of the elongated support member 103A, and each of the casings 103B contains a photoelectric device for converting an optical signal into an electric signal and/or for converting an electric signal into an optical signal.

The photoelectric conversion unit 103 also includes two connectors 103C suitably supported by the respective casings 103B, and each of the connectors 103C is provided with a plurality of connector pins 103C₁ which are connected to the photoelectric device contained in the corresponding casing 103B.

The photoelectric conversion unit 103 further includes a plurality of optical fibers 103D provided in each of the casings 103B. One end of each of the optical fibers 103D is optically connected to the photoelectric device contained in the corresponding casing 103B, and the other end of the optical fiber 103D concerned is optically connected to, for example, a photoelectric device of another optical module (not shown).

Figure 1B:
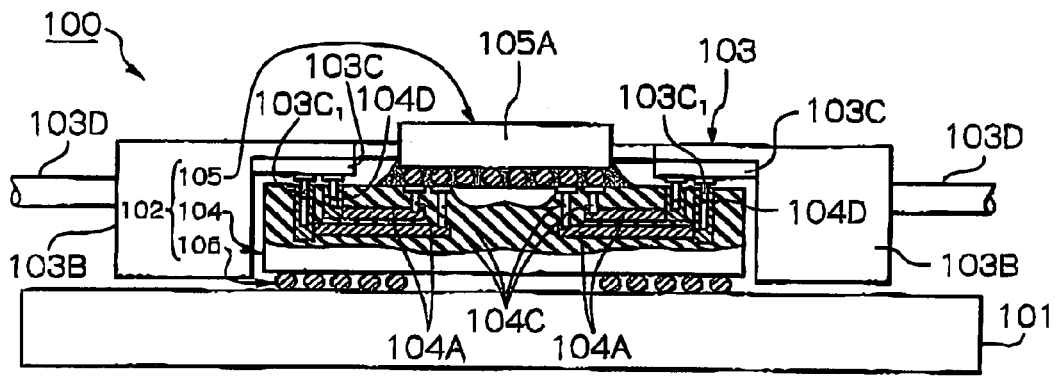
FIG. 1B is a partially cut-off elevation view of the first prior art optical module of FIG. 1A.

As shown in FIG. 1B which is a partially cut-off elevation view of the optical module 100 of FIG. 1A, the photoelectric conversion unit 103 is attached to the flip-chip type BGA package 102 so that the connector pins 103C₁ are inserted into the respective electric jacks 104D.

In the optical module 100 of FIG. 1B, when an optical signal is fed from one of the optical fibers 103D to a photoelectric device contained in a corresponding casing 103B, it is converted into an electric signal by the photoelectric device concerned, and the converted electric signal is input to the flip-chip type semiconductor device 105 through one of the connector pins 103C₁, one of the electrical jacks 104D, one of the electrical interconnection layers 104A and a via plug 104C, which are connected to each other.

On the other hand, when an electric signal is output from the flip-chip type semiconductor device 105 through one of the metal bumps 105B, it is fed to one of the photoelectric devices through one of the via plugs 104C, one of the electrical interconnection layers 104A, one of the electrical jacks 104D and one of the connector pins 103C₁ which are connected to each other. Then, the electric signal is converted into an optical signal by the photoelectric device concerned, and the converted optical signal is fed to another semiconductor package through a corresponding one of the optical fibers 103D.

Thus, in an electronic apparatus using the optical module 100 of FIG. 1B, although a high speed processing of signals can be achieved, JP-2004-253456 A fails to disclose a concrete internal arrangement of the photoelectric conversion unit 103.

Figure 2A:
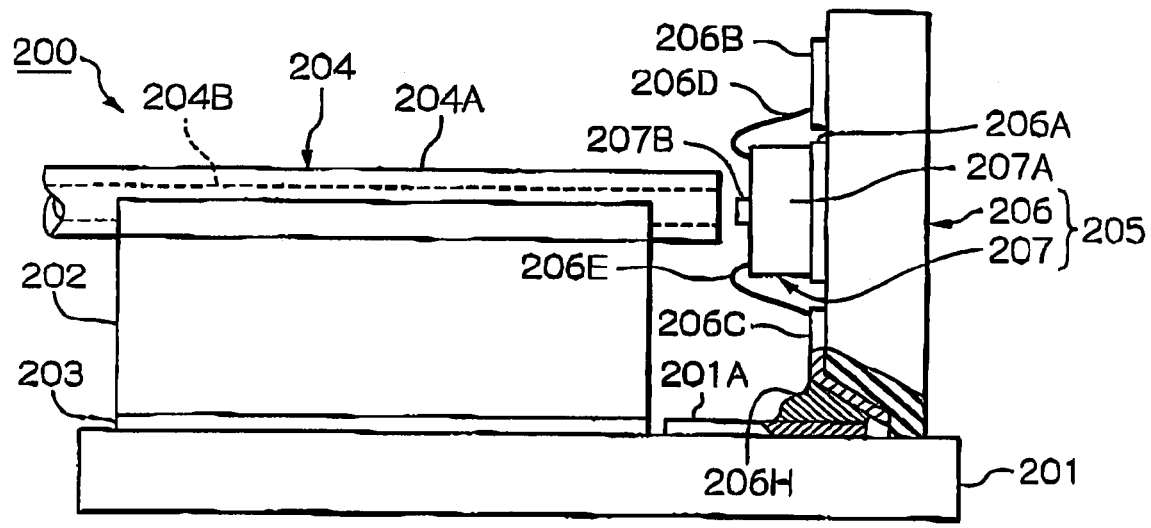
FIG. 2A is a partially cut-off elevation view of a second prior art optical module.

Referring to FIG. 2A which is a partially cut-off elevation view of a second prior art optical module as disclosed in JP-2005-044966 A, the second prior art optical module is generally indicated by reference numeral 200. The optical module 200 includes a wiring board 201, a rest member 202 mounted on and adhered to the wiring board 201 with a suitable adhesive agent layer 203, an optical-signal transmission unit 204 provided on the rest member 202, and a photoelectric conversion unit 205 provided on the wring board 201.

The wiring board 201 has a plurality of electrical interconnection layers (not shown) formed therein, and two electrical connection layers 201A formed on a top surface of the wiring board 201 so as to be suitably connected to the electrical interconnection layers. Note, in FIG. 2A, only one of the electrical connection layers 201A is visible.

The optical-signal transmission unit 204 has a sheet-like holder 204A securely mounted on the rest member 202, and some optical-signal transmission members 204B which are enveloped in the sheet-like holder 204A, and which are arranged at regular intervals therein. For example, each of the optical-signal transmission members 204B may be defined as an optical fiber.

The photoelectric conversion unit 205 includes a rectangular substrate 206 securely and uprightly mounted on the wiring board 201, and a photoelectric device 207 provided on a front face of the rectangular substrate 206.

The rectangular substrate 206 itself is composed of a suitable insulating material such as silicon, ceramic, glass, resin or the like. The rectangular substrate 206 has an electrode pattern layer 206A formed on the front face thereof, and the photoelectric device 207 is mounted on the electrode pattern layer 206A so that a bottom of the photoelectric device 207 is suitably bonded to the electrode pattern layer 206A. Further, the rectangular substrate 206 has electrical connection layers 206B and 206C formed on the front face thereof, and the photoelectric device 207 is connected to the electrical connection layers 206B and 206C by respective bonding-wires 206D and 206E.

The photoelectric device 207 has a semiconductor chip 207A, and some photoelectric conversion elements 207B formed on a top face or circuit formation face of the semiconductor chip 207A. The photoelectric conversion elements 207B are arranged at regular intervals so as to be axially aligned with the optical-signal transmission members or optical fibers 204B. Each of the photoelectric conversion elements 207B may be either a light-emitting element such as a semiconductor laser or a light-receiving element such as a photodiode.

Figure 2B:
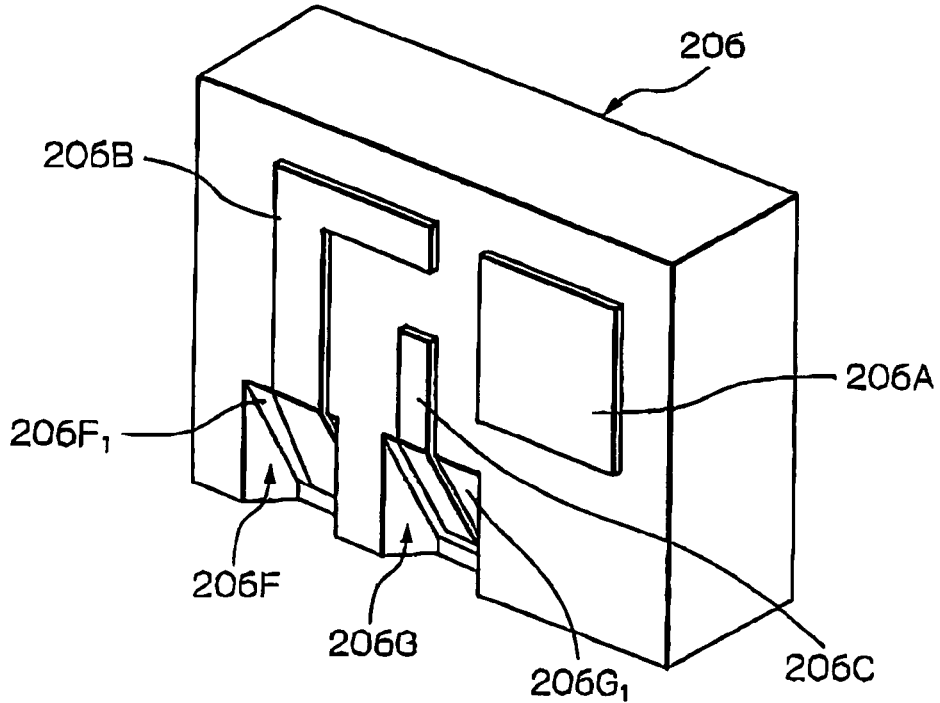
FIG. 2B is a perspective view of a base board which forms a part of the second prior art optical module of FIG. 2A.

As shown in FIG. 2B which is a perspective view of the rectangular substrate 206 of FIG. 2A, two cavities 206F and 206G are formed in the front face of the rectangular substrate 206 at the root thereof so that slant faces 206F₁ and 206G₁ bordering the front face of the rectangular substrate 206 are defined in the respective cavities 206F and 206G, and the electrical connection layers 206B and 206C extend on the slant faces 206F₁ and 206G₁. Note that each of the slant faces 206F₁ and 206G₁ defines an obtuse angle with respect to the front face of the rectangular substrate 206.

Returning to FIG. 2A, each of the electrical connection layers 206B and 206C is electrically connected to the corresponding electrical connection layers 201A with a suitable solder material 206H. At this time, since the solder material 206H is placed in the corresponding cavity 206F or 206G, occurrence of a short circuit can be prevented between the solder materials 206H.

In the optical module 200 of FIG. 2A, when each of the photoelectric conversion elements 207B is the light-emitting element or semiconductor laser, it converts an electric signal into an optical signal, and then emits the converted optical signal to the corresponding optical fiber 204B. On the other hand, when each of the photoelectric conversion elements 207B is the light-receiving element or photodiode, it receives an optical signal from the corresponding optical fiber 204B, and converts the received optical signal into an electric signal.

Thus, similar to the optical module 100 of FIG. 1B, in an electronic apparatus using the optical module 200 of FIG. 2A, it is possible to achieve a high speed processing of signals. Nevertheless, an operational reliability of the optical module 200 is inferior because the soldering of the electrical connection layers 206B and 206C to the respective electrical connection layers 201A is substantially carried out as a spot soldering so that each of the solder materials 206H is liable to come off, and because the electrical connection layers 206B and 206C are liable to cut off at the boundary between the slant faces 206F₁ and 206G₁ and the front face of the rectangular substrate 206 even if each of the slant faces 206F₁ and 206G₁ defines the obtuse angle with respect to the front face of the rectangular substrate 206.

Further, in the optical module 200 of FIG. 2A, the circuit formation face of the optical semiconductor chip 207A with the photoelectric conversion elements 207B may be contaminated by dust. Although the circuit formation face of the optical semiconductor chip 207 may be covered with a transparent resin coating layer so as to be protected from the contamination of dust, a surface of the transparent resin coating layer may be subjected to undulation. Of course, the undulated surface of the transparent resin coating layer exerts a negative influence on a transmission of an optical signal.

Figure 3A:
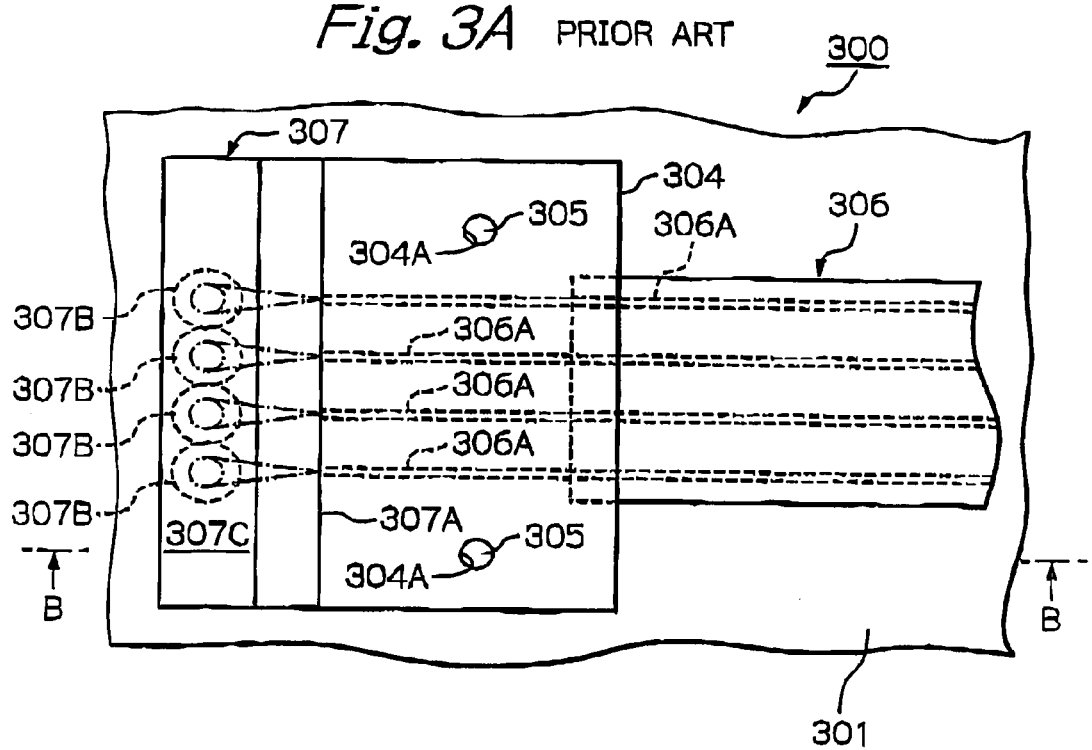
FIG. 3A is a plan view of a third prior art optical module.
Figure 3B:
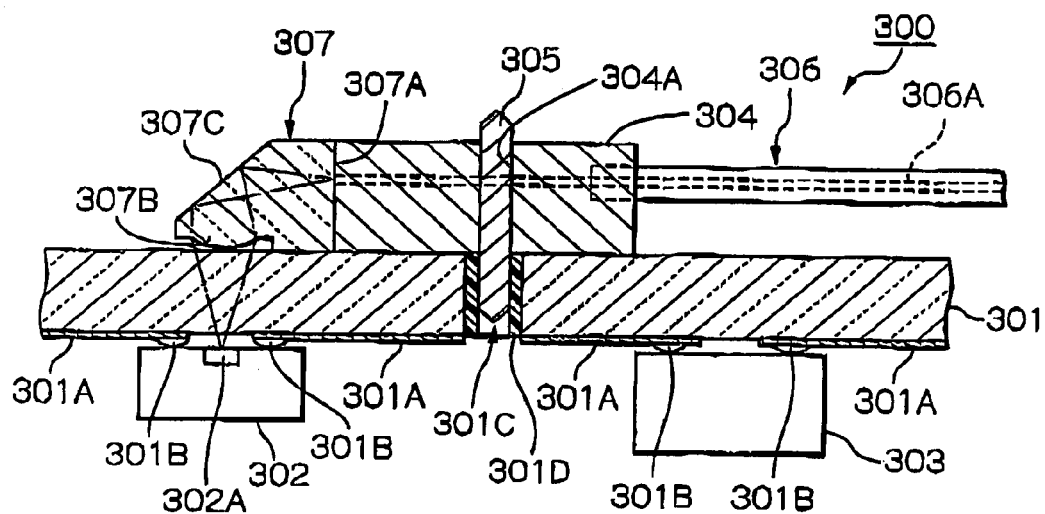
FIG. 3B is a cross-sectional view taken along the B-B line of FIG. 3A.

FIGS. 3A and 3B show a third prior art optical module as disclosed in JP-2004-240220 A. Note that FIG. 3A is a partial plan view of the third prior art optical module, and that FIG. 3B is a cross-sectional view taken along the line B-B line of FIG. 3A.

Referring to FIGS. 3A and 3B, the third prior art optical module is generally indicated by reference numeral 300. The optical module 300 includes a transparent substrate 301 made of suitable transparent material such as glass, plastic, silicon, germanium or the like, a photoelectric device 302 (see: FIG. 3B) provided on a bottom surface of the transparent substrate 301, a semiconductor device 303 (see: FIG. 3B) provided on the bottom surface of the transparent substrate 301 to drive the photoelectric device 302, an optical fiber holder 304 mounted on a top surface of the transparent substrate 301, a pair of positioning pins 305 penetrating into both the transparent substrate 301 and the optical fiber holder 304, a tape-like optical cable 306 suitably held in the optical fiber holder 304, and an optical connector 307 suitably attached to a side face of the optical fiber holder 304.

As shown in FIG. 3B, the transparent substrate 301 has a plurality of electrical connection layers 301A formed on the bottom surface thereof, and some spherical electrode pads 301B suitably bonded on the electrical connection layers 310. The photoelectric device 302 is mounted on the bottom surface of the transparent substrate 301 so as to be connected to a part of the spherical electrode pads 301B, and the semiconductor device 303 is mounted on the bottom surface of the transparent substrate 301 so as to be connected to another part of the spherical electrode pads 301B. In short, the photoelectric device 302 is connected to the semiconductor device 303 through some of the electrical connection layers 301A and some of the spherical electrode pads 301B, so that the photoelectric device 302 is driven by the semiconductor device 303.

As shown in FIG. 3B, the photoelectric device 302 has an array of photoelectric conversion elements 302A formed in a circuit formation face thereof, and each of the photoelectric conversion elements 302A may be either a light-emitting element or a light-receiving element. Note that the mounting of the photoelectric device 302 on the transparent substrate 301 is carried out so that the photoelectric conversion elements 302A are directed to the bottom surface of the transparent substrate 301.

Also, as shown in FIG. 3B, the transparent substrate 301 has a pair of through holes 301C formed therein, and each of the through holes 301C has an inner diameter which is larger than an outer diameter of the positioning pins 305. On the other hand, the optical fiber holder 304 has a pair of through holes 304A formed therein, and the through holes 304A have an inner diameter which is substantially equivalent to the outer diameter of the positioning pins 305, with the through holes 304A being arranged so as to be aligned with the corresponding through hole 301C of the transparent substrate 301.

In manufacturing the optical module 300 of FIGS. 3A and 3B, after the through holes 301C are formed in the transparent substrate 301, a sleeve-like lining 301D (see: FIG. 3B) is formed in the through holes 301C so that a positioning hole is defined by the sleeve-like lining 301D, whereby the optical fiber holder 304 can be properly positioned with respect to the photoelectric device 302.

In particular, a hole definition tool (not shown) having a pair of pins is set on the top surface of the transparent substrate 301 so that the respective pins are inserted into the through holes 301C. Since the pins of the hole definition tool have substantially the same outer diameter as that of the positioning pin 305, a clearance is defined between each of the pins of the hole definition tool and the corresponding hole 301C. Then, each of the clearances is charged with a suitable uncured adhesive agent such a thermosetting resin, a photo-setting resin or the like. Subsequently, a positional fine adjustment of the hole definition tool is carried out so that the hole definition tool is properly positioned with respect to the photoelectric device 302, and the adhesive agents are thermally or optically cured in the through holes 301C. Thereafter, the hole definition tool is removed from the transparent substrate 301 so that the positioning holes are defined in the respective through holes 301C by the respective sleeve-like linings 301D.

Thus, as shown in FIGS. 3A and 3B, when the optical fiber holder 304 with the optical connector 307 is mounted on the top surface of the transparent substrate 301, and when the positioning pins 305 are inserted into the respective through holes 304A and the respective sleeve-like linings 301D, the optical fiber holder 304 with the optical connector 307 is properly positioned with respect to the photoelectric device 302 as the aforesaid hole definition tool was properly done.

The tape-like optical cable 306 contains an array of optical fibers 306A, and each of the optical fibers 306A has an optical end face which is optically connected to the optical connector 307. In particular, the optical connector 307 is composed of a suitable optical glass or a transparent plastic material, and has an optical input/output face 307A to which the optical end faces of optical fibers 306A are optically connected.

As shown in FIGS. 3A and 3B, the optical connector 307 also has an array of lens 307B integrally formed at a bottom thereof, and a reflective face 307C directed to both the optical input/output face 307A and the array of lens 307B. In short, an optical connection is properly established between the array of photoelectric conversion elements 302A of the photoelectric device 302 and the array of optical fibers 306A of the tape-like optical cable 306 due to the proper positioning of the optical fiber holder 304 with respect to the photoelectric device 302 by the positioning pins 305.

When each of the photoelectric conversion elements 302A is a light-receiving element, an optical signal emitted from each of the optical fibers 306A is focused on the corresponding light-receiving element 302A by the optical connector 307, and the optical signal is converted into an electric signal by the light-receiving element 302A.

On the other hand, when each of the photoelectric conversion elements 302A is a light-emitting element, an electric signal is converted into an optical signal by the light-emitting element 302A, and the converted optical signal is focused on the optical end face of the corresponding optical fiber 306A by the optical connector 307.

Thus, in an electronic apparatus using the optical module 300 of FIGS. 3A and 3B, also, it is possible to achieve a high speed processing of signals. Nevertheless, the optical module 300 cannot be efficiently manufactured because each of the photoelectric device 302 and the semiconductor device 303 has to be underfilled with a suitable resin material so that the spherical electrode pads 301B are sealed with the resin material, and because the proper positioning of the optical fiber holder 304 with respect to the photoelectric device 302 is troublesome.

Further, in the optical module 300 of FIGS. 3A and 3B, before proper electrical connections can be established between the electrical connection layers 301A and both the photoelectric device 302 and the semiconductor device 303, impedance matching circuit units have to be provided on the transparent substrate 301, resulting in bulkiness of the optical module 300 and in increase in production cost for the optical module 300.

First Embodiment

With reference to FIGS. 4A to 4F which are cross-sectional views, a method for manufacturing a first embodiment of an optical unit according to the present invention will be explained below.

First, as shown in FIG. 4A, a flexible transparent sheet 11 is prepared. The flexible transparent sheet 11 may be made by laminating some transparent polyimide films in order. A ground layer 12, which may be composed of copper (Cu), is formed in a surface of the flexible transparent sheet 11 by using a variety of processes such as an electroplating process, a photolithography process, an etching process, and so on.

Note that, for the sake of convenience of explanation, the surface of the flexible transparent sheet 11, on which the ground layer 12 is formed, is defined and referred to as an outer surface, and that the opposite surface of the flexible transparent sheet 11 is defined and referred to as an inner surface.

Also, a plurality of electrode pads, only five of which are representatively illustrated and indicated by references 13, are formed in respective cavities defined in the outer surface of the flexible transparent sheet 11. Each of the electrode pads 13 may be defined by both a nickel (Ni) layer and gold (Au) layer buried in the corresponding cavity, and a tin/silver (Sn/Ag) alloy solder layer with which the gold (Au) layer is coated. The formation of the electrode pads 13 may be carried out by using a variety of processes such as an electroplating process, a photolithography process, an etching process, and so on.

Further, while the transparent polyimide films are laminated in order to thereby form the flexible transparent sheet 11, a group 14 of electrical interconnection layers are formed in the flexible transparent sheet 11 and only one of the electrical interconnection layers is representatively illustrated and indicated by reference 14A. One end of the electrical interconnection layer 14A is connected to an electrode terminal 15 formed in the flexible transparent sheet 11, and the other end of the electrical interconnection layer 14A is suitably connected to one of the electrode pads 13.

Also, a group 16 of electrical interconnection layers 16A and 16B (see: FIG. 5) are formed in the flexible transparent sheet 11, and only one of the electrical interconnection layers 16A is visible in FIG. 4A. The ends of the electrical interconnection layer 16A are connected to respective electrode terminals 17 and 18 formed in the flexible transparent sheet 11.

Further, a group 19 of electrical interconnection layers are formed in the flexible transparent sheet 11, and only one of the electrical interconnection layers is representatively illustrated and indicated by reference 19A. One end of the electrical interconnection layer 19A is connected to an electrode terminal 20 formed in the flexible transparent sheet 11, and the other end of the electrical interconnection layer 19A is suitably connected to another of the electrode pads 13.

Each of the electrical interconnection layers included in the groups 14, 16 and 19 may be composed of copper (Cu), and the formation of all the electrical interconnection layers may be simultaneously carried out by using a variety of processes such as an electroplating process, a photolithography process, an etching process, and so on.

Also, similar to the electrode pads 13, each of the electrode terminals 15, 18 and 19 may be defined by both a nickel (Ni) layer and gold (Au) layer formed in the flexible transparent sheet 11, and a tin/silver (Sn/Ag) alloy solder layer with which the gold (Au) layer is coated. The formation of the electrode terminals 15, 18 and 19 may be simultaneously carried out by using a variety of processes such as an electroplating process, a photolithography process, an etching process, and so on.

On the other hand, as shown in FIG. 4B, photoelectric conversion chips 21 and 22 and semiconductor chips 23 and 24 are prepared.

The photoelectric conversion chip 21 serves as a light emitting element, and may be formed as a vertical cavity surface emitting laser (VCSEL) chip. The VCSEL chip 21 is configured as a plate-like chip, and has a circuit formation face 21A, and a plurality of metal bumps 21B bonded to the circuit formation face 21A. Although not illustrated, the VCSEL chip 21 is provided with four light emitters (lasers) formed in the circuit formation face 21A thereof, and the light emitters are aligned with each other at regular intervals. Note, in FIG. 4B, only two of the metal bumps 21B are representatively illustrated.

The photoelectric conversion chip 22 serves as a light-receiving element, and may be formed as a photodiode chip such as a p-intrinsic-n (PIN) photodiode chip, an avalanche photodiode chip, a p-n junction (PN) photodiode chip, a Schottky photodiode chip or the like. The photodiode chip 22 is configured as a plate-like chip, and has a circuit formation face 22A, and a plurality of metal bumps 22B bonded to the circuit formation face 22A. Although not illustrated, the photodiode chip 22 has four light receivers (photodiodes) formed in the circuit formation face 22A thereof, and the light receivers are aligned with each other at regular intervals. Note, in FIG. 4B, only two of the metal bumps 22B are representatively illustrated.

The semiconductor chip 23 is formed as a peripheral integrated-circuit (IC) chip for driving the VCSEL chip 21. The peripheral IC chip 23 is configured as a plate-like chip, and has a circuit formation face 23A, and a plurality of metal bumps 23B bonded to the circuit formation face 23A. Note, in FIG. 4B, only two of the metal bumps 23B are representatively illustrated.

The semiconductor chip 24 is formed as a peripheral integrated-circuit (IC) chip for driving the photodiode chip 22. The peripheral IC chip 24 is configured as a plate-like chip, and has a circuit formation face 24A, and a plurality of metal bumps 24B bonded to the circuit formation face 24A. Note, in FIG. 4B, only two of the metal bumps 24B are representatively illustrated.

Next, as shown in FIG. 4C, the VCSEL chip 21 is mounted on the inner surface of the flexible transparent sheet 11 so that the metal bumps 21B are bonded to the respective electrode terminals 15 and 17. When the mounting of the VCSEL chip 21 is carried out, the flexible transparent sheet 11 is heated to about 200° C. so as to be softened, and thus the metal bumps 21B can easily penetrate into the flexible transparent sheet 11, whereby ensuring it is possible to ensure the bonding of the metal bumps 21B to the electrode terminals 15 and 17.

Also, although the photodiode chip 22 is mounted on the inner surface of the flexible transparent sheet 11 in a similar manner to that in the mounting of the VCSEL chip 21, the photodiode chip 22 is not visible because it is behind the VCSEL chip 21.

On the other hand, the peripheral IC chip 23 is also mounted on the inner surface of the flexible transparent sheet 11 a similar manner to that in the mounting of the VCSEL chip 21, so that the metal bumps 23B are bonded to the respective electrode terminals 18 and 20, whereby an electrical connection is established between the VCSEL chip 21 and the peripheral IC chip 23.

Also, although the peripheral IC chip 24 is mounted on the inner surface of the flexible transparent sheet 11 in a similar manner to that in the mounting of the VCSEL chip 21 so as to be electrically connected to the photodiode chip 22, the peripheral IC chip 24 is not visible because it is behind the peripheral IC chip 23.

In FIG. 4C, it appears as if the VCSEL chip 21 is illustrated so that the circuit formation face 21A thereof is wholly covered with the ground layer 12, but, in reality, the light emitters on the circuit formation face 21A cannot be covered with the ground layer 12 so that an optical connection for each of the light emitters can be ensured. Note that the same is true for the photodiode chip 22.

Figure 4D:
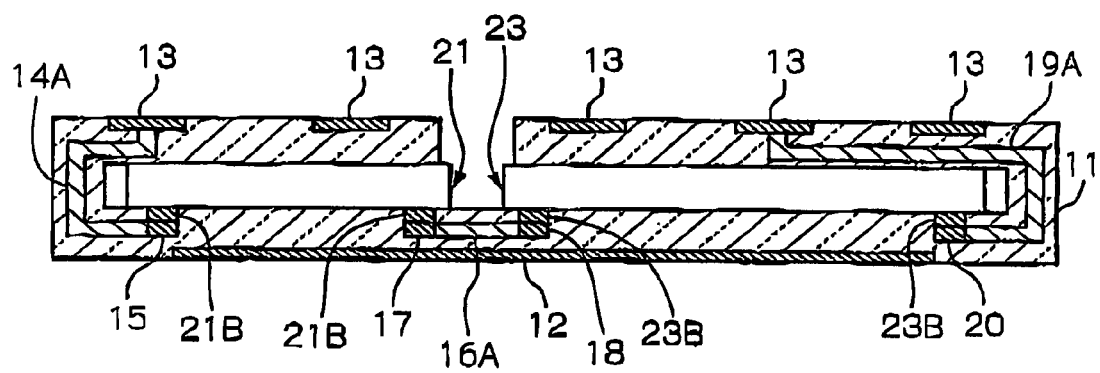

Next, as shown in FIG. 4D, the flexible transparent sheet 11 is folded so that the VCSEL chip 21, the photodiode chip 22 and the peripheral IC chips 23 and 24 are wrapped with and sealed in the folded flexible transparent sheet 11, to thereby produce an enveloper enveloping the VCSEL chip 21, the photodiode chip 22 and the peripheral IC chips 23 and 24. When the folding of the flexible transparent sheet 11 is carried out, the flexible transparent sheet 11 is heated to about 200° C. so as to be softened, and the inner surface of the softened flexible transparent sheet 11 can be firmly adhered to the VCSEL and photodiode chips 21 and 22 and the peripheral IC chips 23 and 24, resulting in a production of an optical unit in which the VCSEL and photodiode chips 21 and 22 and the peripheral IC chips 23 and 24 are packaged in the folded flexible transparent sheet 11.

Figure 4E:
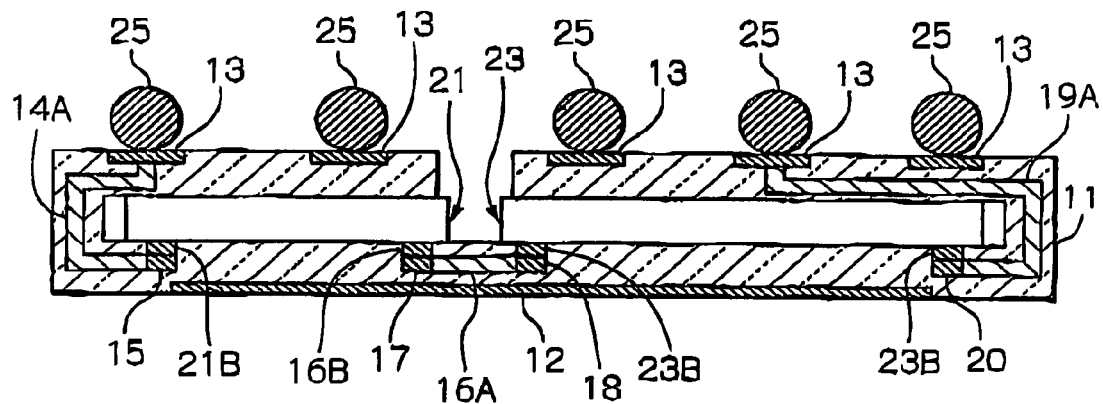

Next, as shown in FIG. 4E, a plurality of metal balls such as solder balls 25 may be bonded onto the respective electrode pads 13 in a conventional manner. In this case, the optical unit carrying the solder balls 25 may be defined as a so-called ball grid array (BGA) package.

Figure 4F:
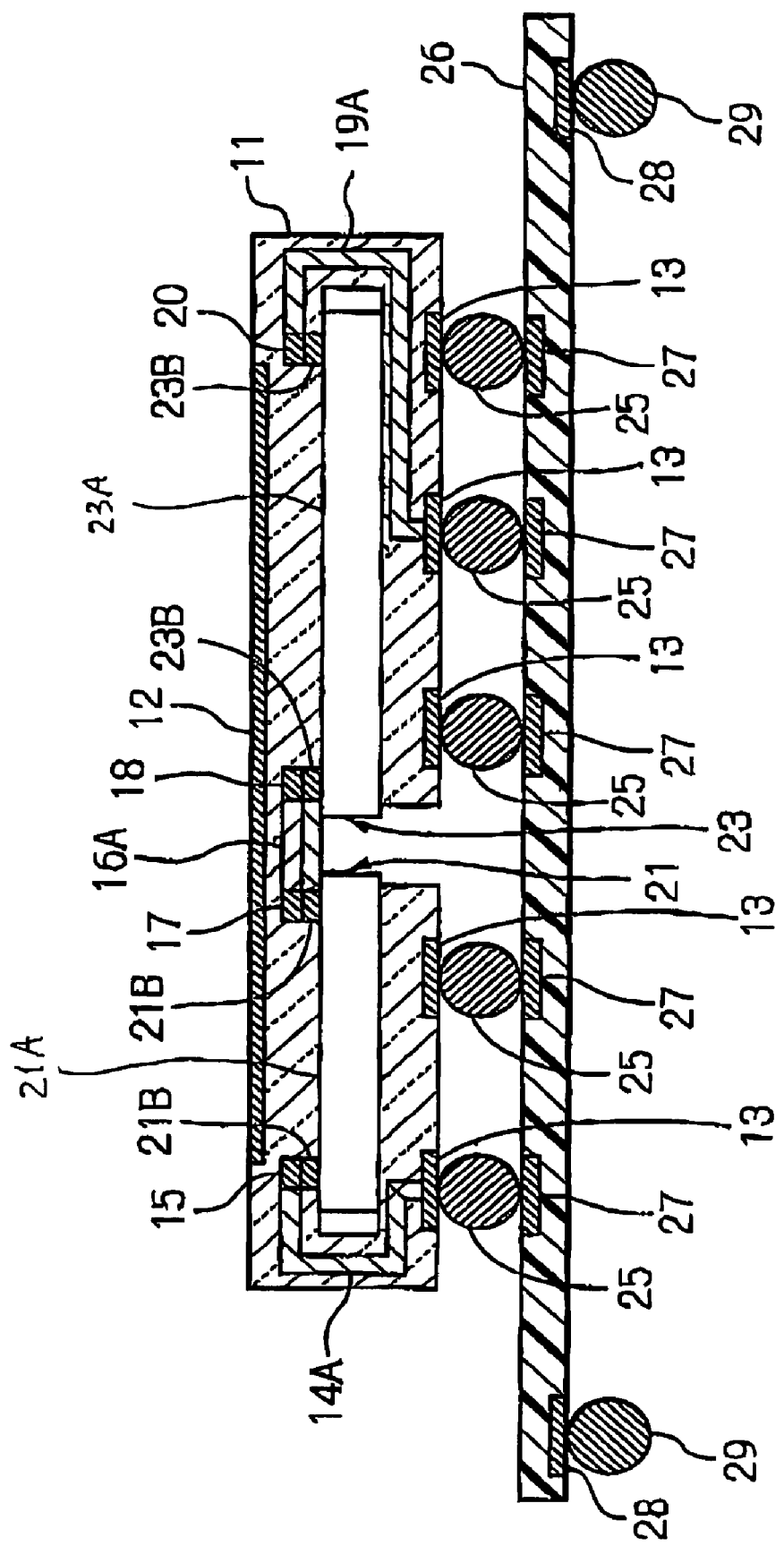

Next, as shown in FIG. 4F, the optical unit of FIG. 4E may be mounted on a rectangular interposer 26. Namely, the rectangular interposer 26 has a plurality of electrode pads 27 formed in a surface of thereof, and a plurality of electrode pads 28 formed in the other surface thereof, and the mounting of the optical unit of FIG. 4F on the rectangular interposer 26 is carried out so that the solder balls 25 are bonded onto the respective electrode pads 27. Also, the rectangular interposer 26 has a plurality of solder balls 29 bonded onto the electrode pads 28. Note, in FIG. 4F, only two of the solder balls 29 are representatively illustrated.

FIG. 5 is a schematic plan view showing positional relationships among the VCSEL chip 21, the photodiode chip 22 and the peripheral IC chips 23 and 24 in a plan view, which are extracted from the optical unit of FIG. 4F.

As shown in FIG. 5, the VCSEL chip 21 and the peripheral IC chip 23 are juxtaposed with each other, and are connected to each other by the group 16 of electrical interconnection layers 16A and 16B, which are alternately arranged in the flexible transparent sheet 11 (see: FIG. 4F), and each of the electrical interconnection layers 16A and 16B has the electrode terminals 17 and 18 connected to the ends thereof. Each of the electrical interconnection layers 16A serves as a signal line. Each of the electrical interconnection layers 16B serves as a ground line, and is connected to the ground layer 12 (see: FIG. 4F) through a via plug 16C formed in the flexible transparent sheet 11 (see: FIG. 4F).

Similarly, the photodiode chip 22 and the peripheral IC chip 24 are juxtaposed with each other, and are connected to each other by a group 16' of electrical interconnection layers 16A' and 16B', which are alternately arranged in the flexible transparent sheet 11 (see: FIG. 4F), and each of the electrical interconnection layers 16A' and 16B' has electrode terminals 17' and 18' connected to the ends thereof. Each of the electrical interconnection layers 16A' serves as a signal line. Each of the electrical interconnection layers 16B' serves as a ground line, and is connected to the ground layer 12 (see: FIG. 4F) through a via plug 16C' formed in the flexible transparent sheet 11 (see: FIG. 4F).

With the arrangement of FIG. 5, since the potential of the ground lines 16B and 16B' is maintained at the ground level, it is possible to prevent crosstalk among the signal lines 16A and 16A'. Also, since the signal lines 16A and 16A' are formed together with the ground layer 12 in the folded flexible transparent sheet 11 (see: FIG. 4F), an impedance matching circuit (not shown) for the signal lines 16A and 16A' can be easily incorporated in the folded flexible transparent sheet 11 (see: FIG. 4F).

Note that the signal lines 16A and 16A' and the ground lines 16B and 16B' have a length of at most several tens of micrometers.

Referring to FIG. 6 which is a perspective view of an optical module according to the present invention, the optical module is generally indicated by reference numeral 30, and includes an optical unit housing 31 containing the optical unit of FIG. 4F, and an optical fiber unit 32 detachably mounted on the optical unit housing 31.

The optical unit housing 31 has a rectangular side wall frame 31A which may be made of a suitable hard resin material, and which is securely mounted on the rectangular interposer 26 of the optical unit of FIG. 4F, and a transparent plate 31B which may be made of a suitable optical glass material, and which is securely mounted on the rectangular side wall frame 31A.

The optical fiber unit 32 includes an optical connector 32A which may be made of a suitable hard resin material, and a flat flexible optical fiber cable 32B which may be made of a suitable resin material, and which is suitably coupled to the optical connector 32A. The flexible optical fiber cable 32B includes an array of optical fibers which are regularly arranged therein.

The optical module 30 is mounted on a module substrate 33, which is formed as a suitable wiring board, so that an electrical connection is established between the optical module 30 and the module substrate 33 through the solder balls 29 (see: FIG. 4F). Note, in FIG. 6, the solder balls 29 are not visible.

Referring to FIG. 7 which is a cross-sectional view taken along the VII-VII line of FIG. 6, the optical module of FIG. 4F is generally indicated by reference numeral 34, and one of the optical fibers included in the flat flexible optical fiber cable 32B is indicated by reference $32B_1$.

The optical connector 32A of the optical fiber unit 32 has a positioning groove $32A_1$ formed in a bottom surface thereof, and one end of the flat flexible optical fiber cable 32B is fittedly received in the positioning groove $32A_1$. Also, the optical connector 32A has a support plate $32A_2$ securely attached to the bottom surface thereof, so that the end of the flat flexible optical fiber cable 32B is fixed in the positioning groove $32A_1$.

Also, the optical connector 32A has a cavity $32A_3$ formed in the bottom surface thereof so as to be adjacent to the positioning groove $32A_1$, and a part of the cavity $32A_3$ is defined by a slant face to which an optical mirror $32A_4$ is securely attached. The optical mirror $32A_4$ has a reflective surface which is inclined to define an angle of 45° with respect to the end face of the flat flexible optical fiber cable 32B.

Further, the optical connector 32A has some positioning pins $32A_5$ projected from the bottom surface thereof, and some position pins $32A_6$ projected from an outer surface of the support plate $32A_2$. On the other hand, the transparent plate 31B of the optical unit housing 31 has positioning holes $31B_1$ and $31B_2$ formed therein. The optical fiber unit 32 is mounted on the optical unit housing 31 so that the positioning pins $32A_5$ are inserted into the positioning holes $31B_1$, and so that the positioning pins $32A_6$ are inserted into the positioning holes $31B_2$.

In short, whenever the optical fiber unit 32 is mounted on the optical unit housing 31, the flat flexible optical fiber cable 32B is properly positioned with respect to the optical unit 34 contained in the optical unit housing 31, so that an optical connection is established between the flat flexible optical fiber cable 32B and the optical unit 34.

As shown in FIG. 7, the wiring board or module substrate 33 has a plurality of electrode pads 33A formed in a surface thereof, and a plurality of electrode pads 33B formed in the other surface thereof. Note that only two of the electrode pads 33A and only two of the electrode pads 33B are representatively illustrated.

The mounting of the optical module 30 on the module substrate 33 is carried out so that the solder balls 29 are bonded onto the respective electrode pads 33A. Also, the module substrate 33 is provided with solder balls 35 bonded onto the respective electrode pads 33B.

Figure 8:
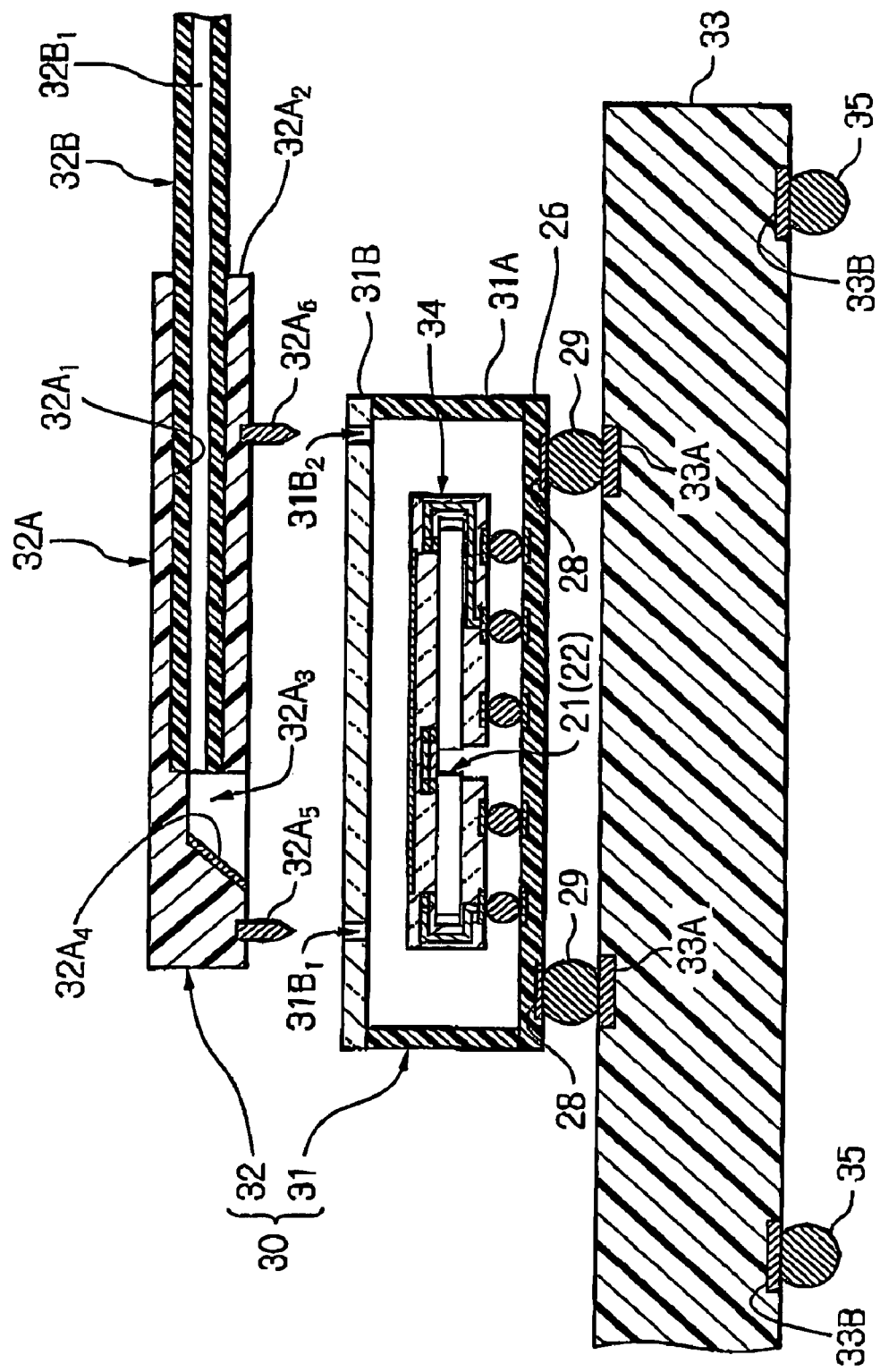
FIG. 8 is a cross-sectional view corresponding to FIG. 7.

As shown in FIG. 8 which is a cross-sectional view corresponding to FIG. 7, the optical fiber unit 32 is detachable from the optical unit housing 31. Accordingly, when an electronic apparatus using the optical module 30 is constructed, it is possible to conveniently and easily carry out an arrangement of the optical module 30.

In the optical module 30 of FIGS. 7 and 8, a part of which is formed as either an opening area or a transparent area plate, may be substituted for the transparent plate 31B. In this case, of course, either the opening area or the transparent area is positioned above both the VCSEL chip 21 and the photodiode chip 22.

Figure 9:
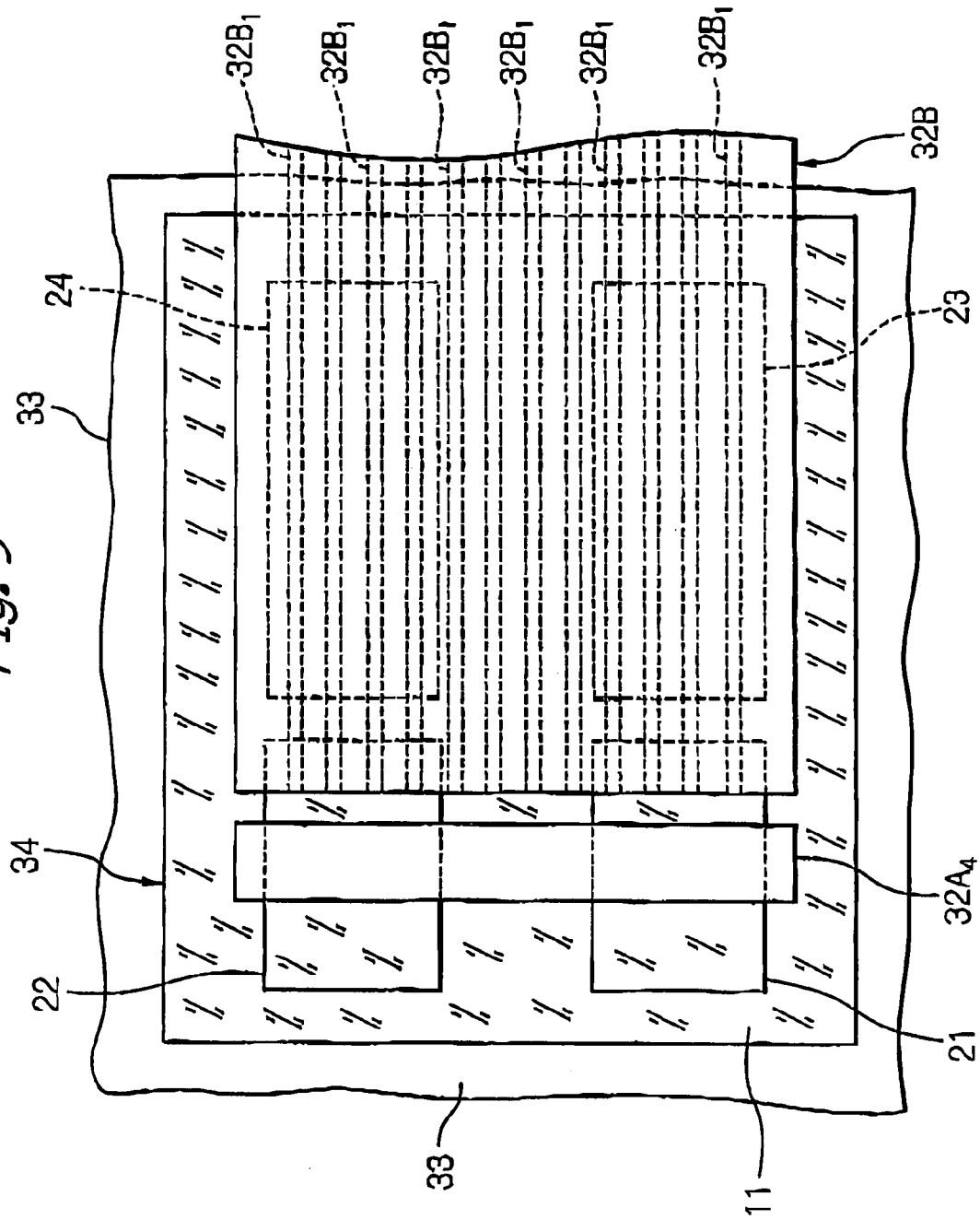
FIG. 9 is a plan view showing a positional relationship among some elements of the optical module of FIGS. 6 and 7.

FIG. 9 is a schematic plan view showing positional relationships among the flat flexible optical fiber cable 32B, the optical mirror $32A_4$, the module substrate 33 and the optical unit 34, which are extracted from the optical module 30 of FIGS. 6, 7 and 8.

Referring to FIG. 9, the flat flexible optical fiber cable 32B, which is available from an electronic market, contains twelve optical fibers $32B_1$, and only eight of the optical fibers $32B_1$ are utilized in the optical module 30.

In particular, when the optical fiber unit 32 is mounted on the optical unit housing 31, four of the optical fibers $32B_1$ are optically connected to the light emitters of the VCSEL chip 21 by the optical mirror $32A_4$, and other four of optical fibers $32B_1$ are optically connected to the light receivers of photodiode chip 22.

Accordingly, when an electrical signal is converted into an optical signal by one of the light emitters of the VCSEL chip 21, the converted optical signal is reflected by the optical mirror $32A_4$ so as to be made incident on the end face of a corresponding optical fiber $32B_1$. On the other hand, when an optical signal is output from one of the optical fibers $32B_1$, and when the output optical signal is reflected by the optical mirror $32A_4$ so as to be made incident on a corresponding light receiver of the photodiode chip 22, the optical signal is converted into an electrical signal by the light receiver concerned.

With the arrangement of the optical module shown in FIGS. 7, 8 and 9, an optical path between the optical fibers $32B_1$ and the light emitter of the VCSEL chip 21 is sufficiently small (abut 200 μm). Also, a laser beam emitted from the VCSEL chip 21 features a circular cross-section and a small radiation angle. Thus, it is possible to ensure a proper optical connection between the optical fibers $32B_1$ and the light emitters of the VCSEL chip 21 without using a focus lens system provided that a misalignment between the optical fibers 32B, and the light emitters of the VCSEL chip 21 falls within a permissible range of about 5 μm.

Note that an optical prism may be complementally received in the cavity $32A_3$ as a substitute for the optical mirror $32A_4$. Also, note that one of the VCSEL chip 21 and the photodiode chip 22 may be omitted together with the corresponding peripheral IC chip 23 or 24 from the optical unit 34, if necessary.

Figure 10:
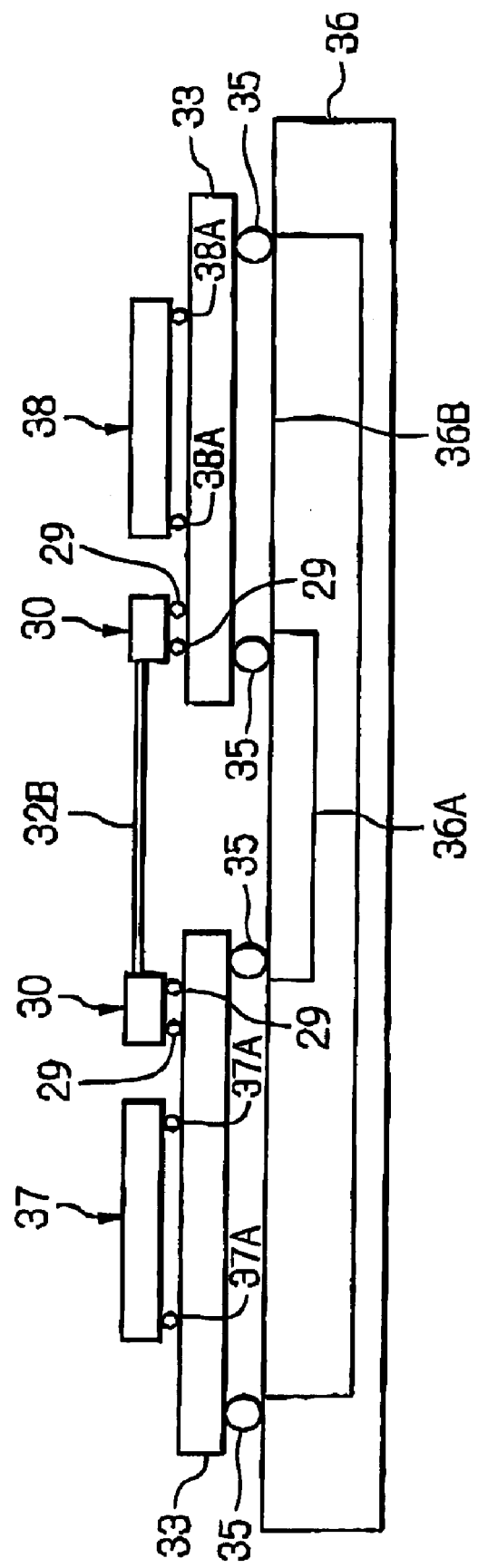
FIG. 10 is a schematic perspective view of an electronic apparatus having two optical modules, each of which is constructed as shown in FIGS. 6 and 7.

FIG. 10 shows an electronic apparatus having two optical modules 30, each of which is constructed as shown in FIGS. 6 and 7.

As shown in FIG. 10, the electronic apparatus includes a motherboard 36 which has a plurality of signal interconnection layers symbolically represented by a signal line 36A, and a plurality of power interconnection layers symbolically represented by a power line 36B. Note that the power line 36B may be defined as a ground line.

The electronic apparatus also includes wiring boards or module substrates 33, each of which is constructed as shown in FIG. 7, and the module substrates 33 are mounted on the motherboard 36 so that each of the module substrates 33 is suitably connected to the signal line 36A and the power line 36B through solder balls 35.

The electronic apparatus further includes a high-speed semiconductor processor 37 having a plurality of metal bumps 37A bonded onto a circuit formation face thereof, and a high-speed semiconductor processor 38 having a plurality of metal bumps 38A bonded onto a circuit formation face thereof. The high-speed semiconductor processor 37 is mounted on one of the module substrates 33 so that an electrical connection is established therebetween through the metal bumps 37A, and the high-speed semiconductor processor 38 is mounted on the other module substrate 33 so that an electrical connection is established therebetween through the metal bumps 38B. Each of the high-speed semiconductor processors 37 and 38 may be formed as an operation processor such as an application specific integrated circuit (ASIC) chip, a field programmable gate array (FPGA) chip or the like. Otherwise, each of the high-speed semiconductor processors 37 and 38 may be formed as a cross-switch circuit chip.

The electronic apparatus further includes optical modules 30, each of which is constructed as shown in FIG. 7, and each of the optical modules 30 is mounted on one of the module substrates 33 so that an electrical connection is established therebetween through a plurality of metal bumps 29. Also, the optical modules 30 are optically connected to each other through a flat flexible optical fiber cable 32B.

With the arrangement of the electronic apparatus of FIG. 10, since high-speed signals can be transmitted as optical signals from one of the high-speed processors 37 and 38 to the other high-speed processor 37 or 38, it is possible to achieve a high speed processing of signals.

Also, when the electronic apparatus of FIG. 10 becomes inoperable, it is possible to easily seek the causes therefor because the high-speed signals, which are processed in the high-speed semiconductor processors 37 and 38 and the optical modules 30, are isolated from low-speed signals, transmitted in the motherboard 36, by using the module substrates 33.

Further, since an optical assembly including the optical module 30, the module substrate 33 and the high-speed semiconductor processor 37 or 38 can be independently manufactured regardless of the motherboard 36, it is possible to efficiently construct the electronic apparatus of FIG. 10 at low cost, because a defective optical assembly or a defective motherboard can be excluded from the construction of the electronic apparatus of FIG. 10.

Furthermore, although it is troublesome to resolve an electromagnetic-wave radiation problem in a conventional motherboard in which the high-speed signals and the low-speed signals are transmitted, the electronic apparatus of FIG. 10 is free from the electromagnetic-wave radiation problem because it is possible to compactly arrange the aforesaid optical assembly. In reality, when the module substrates 33 had a size of 5×5 cm, and when 10 GHz signals were used as the high-speed signals, it was experimentally confirmed that the high-speed signals exhibit a superior quality.

Second Embodiment

FIG. 11, which corresponds to FIG. 5, shows a second embodiment of the optical unit according to the present invention.

In the second embodiment, the via plugs 16C of FIG. 5 are omitted from the electrical interconnection layers or ground lines 16B, and the via plugs 16C' of FIG. 5 are omitted from the electrical interconnection layers or ground lines 16B'. Namely, the ground lines 16B and 16B are not connected to the ground layer 12 (see: FIG. 4F). Otherwise, the ground lines 16B and 16B are suitably connected to a ground layer (not shown) formed in the module substrate 33 (see: FIG. 7). In this case, the ground layer 12 (see: FIG. 4F) may be omitted from the optical unit, if necessary. Of course, in this case, the crosstalk among the signal lines 16A and 16A' can be prevented because the potential of the ground lines 16B and 16B' is maintained at the ground level.

Third and Fourth Embodiments

Figure 12A:
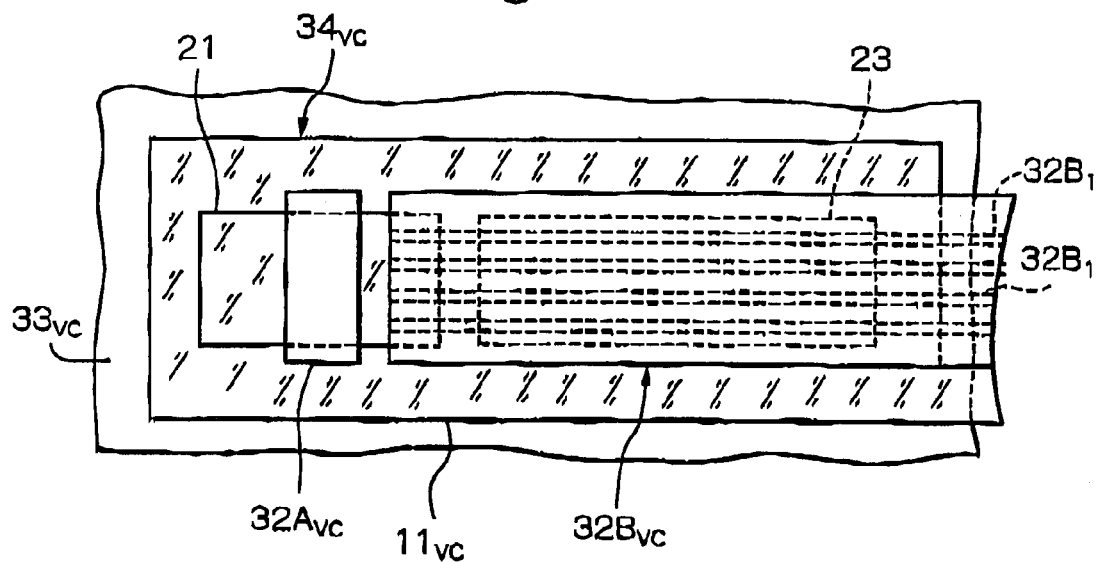
FIG. 12A is a plan view corresponding to FIG. 9, which shows a third embodiment of the optical unit according to the present invention.
Figure 12B:
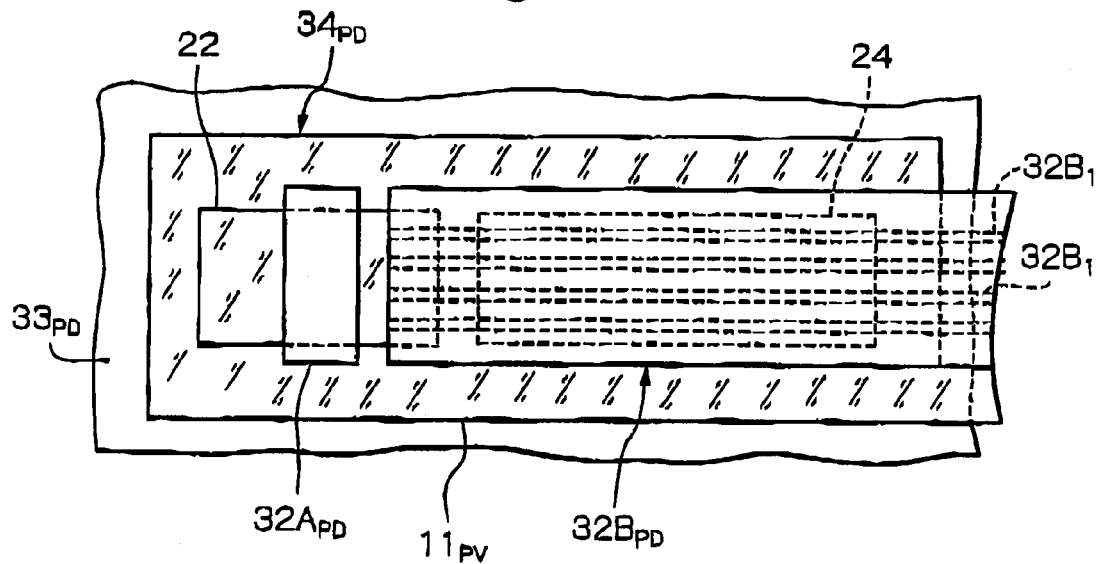
FIG. 12B is a plan view corresponding to FIG. 9, which shows a fourth embodiment of the optical unit according to the present invention.

FIGS. 12A and 12B, which correspond to FIG. 9, respectively show third and fourth embodiments of the optical units according to the present invention.

In the third embodiment of FIG. 12A, an optical unit, generally indicated by reference $34_{VC}$, has only both a VCSEL chip 21 and a peripheral IC chip 23, which are wrapped with and sealed in a folded flexible transparent sheet $11_{VC}$, to thereby produce an enveloper enveloping the VCSEL chip 21 and the peripheral IC chip 23. The optical unit $34_{VC}$ is mounted on a module substrate $33_{VC}$. Also, a flat flexible optical fiber cable $32B_{VC}$ has four optical fibers $32B_1$ which are optically connected to the light emitters of the VCSEL chip 21 through an optical mirror $32A_{VC}$.

On the other hand, in the fourth embodiment of FIG. 12B, an optical unit, generally indicated by reference $34_{PD}$, has only both a photodiode chip 22 and a peripheral IC chip 24, which are wrapped with and sealed in a folded flexible transparent sheet $11_{PD}$, to thereby produce an enveloper enveloping the photodiode chip 22 and the peripheral IC chip 34. The optical unit $34_{PD}$ is mounted on a module substrate $33_{PD}$. Also, a flat flexible optical fiber cable $32B_{PD}$ has four optical fibers $32B_1$ which are optically connected to the light receivers of the VCSEL chip 21 through an optical mirror $32A_{PD}$.

Figure 13:
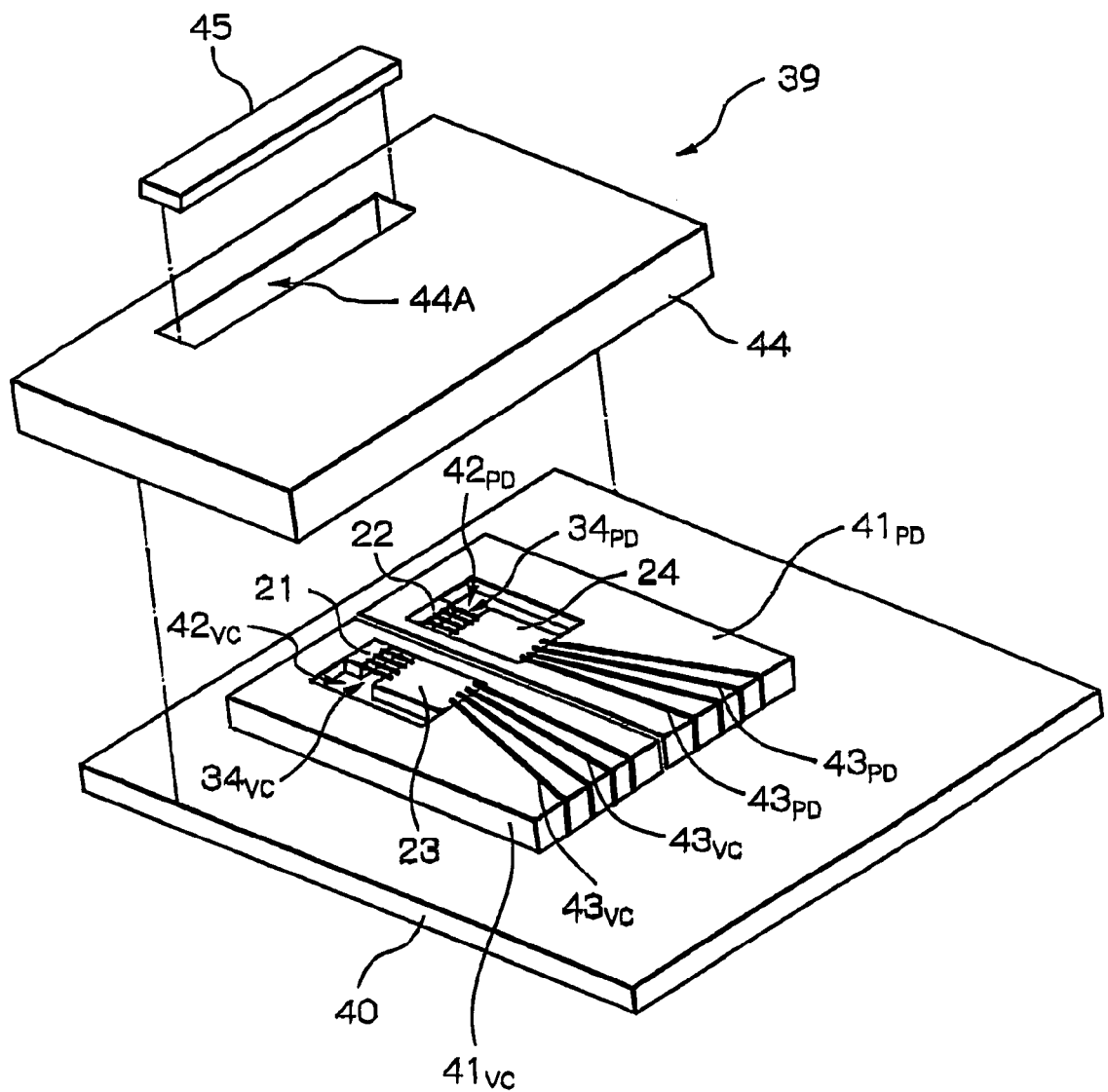
FIG. 13 is a schematic perspective view of an optical module having the optical unit of FIG. 12A and the optical unit of FIG. 12B.

Referring to FIG. 13 which is a schematic perspective view of an optical module, the optical module is generally indicated by reference numeral 39.

The optical module 39 includes the optical unit $34_{VC}$ of FIG. 12A and the optical unit $34_{PD}$ of FIG. 12B, and the optical units $34_{VC}$ and $34_{PD}$ are mounted on a suitable wiring board or module substrate 40 so as to be arranged side by side. Note, in FIG. 13, the folded transparent sheets $11_{VC}$ and $11_{PD}$ are omitted to avoid complexity of illustration.

The optical module 39 also includes heat sinks $41_{VC}$ and $41_{PD}$ which have respective rectangular openings $42_{VC}$ and $42_{PD}$ formed therein, and which may be composed of a suitable metal material, a suitable ceramic material or the like. The heat sinks $41_{VC}$ and $41_{PD}$ are mounted on the module substrate 40 so that the optical units $34_{VC}$ and $34_{PD}$ are accommodated in the respective rectangular openings $42_{VC}$ and $42_{PD}$.

Note, since each of the VCSEL chip 21, the photodiode chip 22 and the peripheral IC chips 23 and 24 generates a large amount of heat, heat radiation should be efficiently carried out before stable and reliable operation can be ensured in the VCSEL chip 21, the photodiode chip 22 and the peripheral IC chips 23 and 24.

If necessary, connection layers $43_{VC}$ and $43_{PD}$ for the peripheral IC chips 23 and 24 may be formed on the respective heat sinks $41_{VC}$ and $41_{PD}$, and are suitably connected to electrical interconnection layers (not shown) formed in the module substrate 40. Of course, when the heat sinks $41_{VC}$ and $41_{PD}$ are composed of the metal material, they are coated with a suitable insulating material, and the connection layers $43_{VC}$ and $43_{PD}$ are formed on the surfaces of the coated insulating material.

The optical unit 39 further includes a lens holder 44 having an elongated opening 44A formed therein, and a focus lens 45 received in the elongated opening 44A of the lens holder 44. The lens holder 44 is mounted on both the heat sinks $41_{VC}$ and $41_{PD}$ so that both the VCSEL chip 21 and the photodiode chip 22 are aligned with the elongated opening 44A of the lens holder 44.

The optical units $34_{VC}$ and $34_{PD}$ are housed together with the heat sinks $41_{VC}$ and $41_{PD}$ and the lens holder 44 carrying the focus lens 45 by a similar housing (not shown) to the optical unit housing 31 (see: FIG. 7), and a similar optical fiber unit (not shown) to the optical fiber unit 32 (see: FIG. 7) is mounted on the aforesaid similar optical unit housing (not shown).

While the VCSEL chip 21 and the photodiode chip 22 are operated, a large amount of heat is generated for each of the VCSEL and photodiode chips 21 and 22. As the temperature of the VCSEL and photodiode chips 21 and 22 becomes higher, an operation characteristic increasingly deteriorates in each of the VCSEL and photodiode chips 21 and 22. Thus, it is preferable to incorporate the heat sinks $41_{VC}$ and $41_{PD}$ in the optical module 39.

Also, when the lens holder 44 is composed of a similar material to those of the heat sinks $41_{VC}$ and $41_{PD}$, it also serves as a heat sink in conjunction of the heat sinks $41_{VC}$ and $41_{PD}$ the heat sinks.

Further, in the optical module 39 of FIG. 13, it is possible to obtain a superior optical connection between the optical fibers (not shown) and the VCSEL and photodiode chips 21 and 22 due to the focus lens 45 intervening therebetween.

Fifth Embodiment

FIG. 14, which corresponds to FIG. 4F, shows a fifth embodiment of the optical unit according to the present invention.

The fifth embodiment is substantially the same as the first embodiment of FIG. 4F except that the optical unit features a common plate-like heat sink 46 for both the VCSEL chip 21 and the peripheral IC chip 22, which is provided in the folded flexible transparent sheet 11. Also, in the fifth embodiment, the optical unit may be produced by a similar method to that of FIGS. 4A through 4F.

With reference to FIGS. 15A through 15E, a method for manufacturing the optical unit of FIG. 14 is explained below.

Figure 15A:
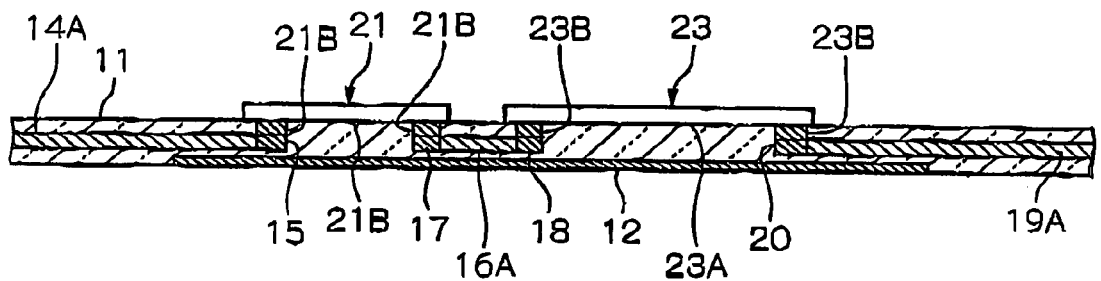
FIGS. 15A through 15E are cross-sectional views for explaining a method for manufacturing the fifth embodiment of FIG. 14.

As shown in FIG. 15A corresponding to FIG. 4C, the VCSEL chip 21 and the peripheral IC chip 23 are mounted on the inner surface of the flexible transparent sheet 11 in a similar manner to that explained with reference to FIG. 4C. Note, although no reference is made to the photodiode chip 22 and the peripheral IC chip 24 for the sake of convenience of explanation, if necessary, the photodiode chip 22 and the peripheral IC chip 24 (see: FIG. 9) may be mounted on the inner surface of the flexible transparent sheet 11.

Figure 15B:
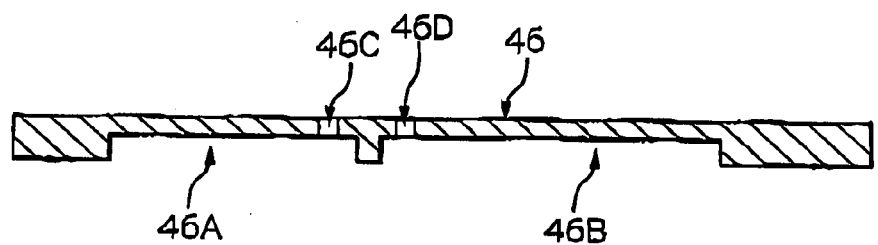

On the other hand, as shown in FIG. 15B which is a cross-sectional view, the common plate-like heat sink 46 is prepared. The common plate-like heat sink 46 has cavities 46A and 46B formed in a surface thereof for receiving both the VCSEL chip 21 and the peripheral IC chip 23, respectively. Also, the common plate-like heat sink 46 has through holes 46C and 46D formed in the other surface thereof, so that the through holes 46C and 46D are in communication with the respective cavities 46A and 46B.

Figure 15C:
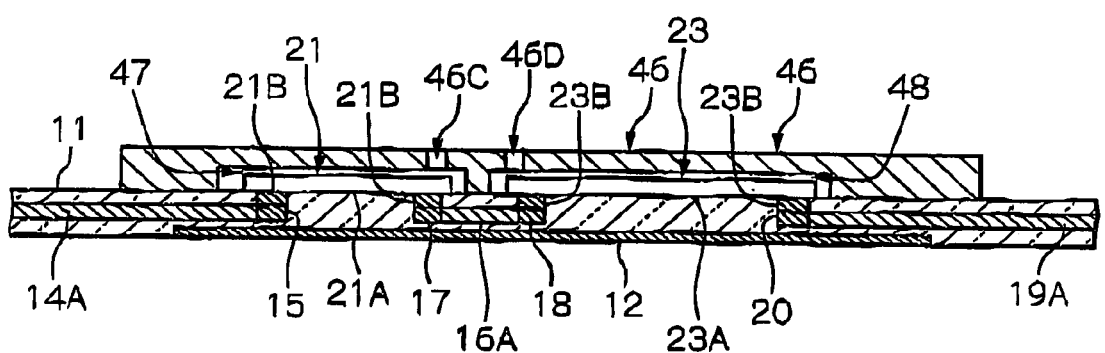

Next, as shown in FIG. 15C which is a cross-sectional view, the common plate-like heat sink 46 is mounted on and adhered to the inner surface of the flexible transparent sheet 11 by heating it to about 200° C., so that the VCSEL chip 21 and the peripheral IC chip 23 are received in the respective cavities 46A and 46B. The cavity 46A has a larger depth than a thickness of the VCSEL chip 21 so that a space 47 is defined therebetween. Similarly, the cavity 46B has a larger depth than a thickness of the peripheral IC chip 23 so that a space 48 is defined therebetween.

Figure 15D:
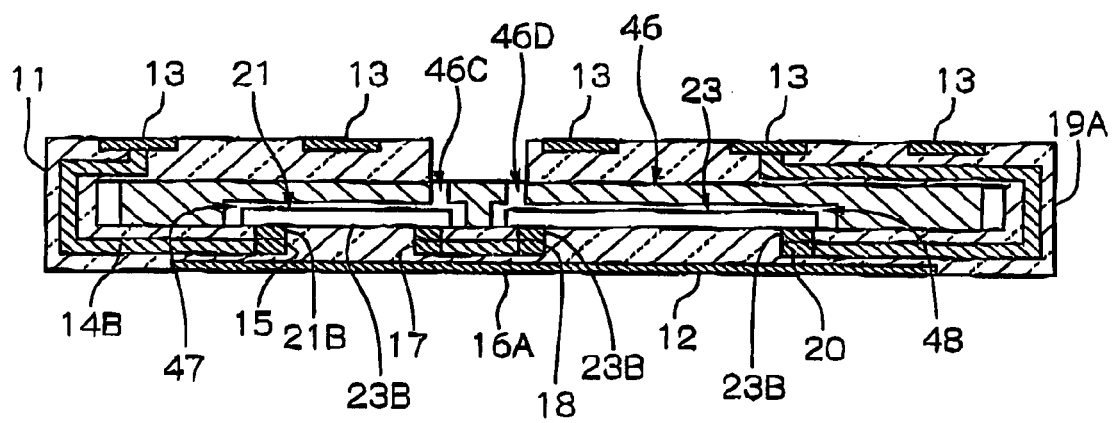

Next, as shown in FIG. 15D, the flexible transparent sheet 11 is folded so that the common plate-like heat sink 46 is wrapped with the folded flexible transparent sheet 11 in a similar manner to that explained with respect to FIG. 4D, whereby the inner surface of the folded flexible transparent sheet 11 is adhered to the other surface of the common plate-like heat sink 46. Note that the through holes 46C and 46D are not closed by the folded flexible transparent sheet 11.

Figure 15E:
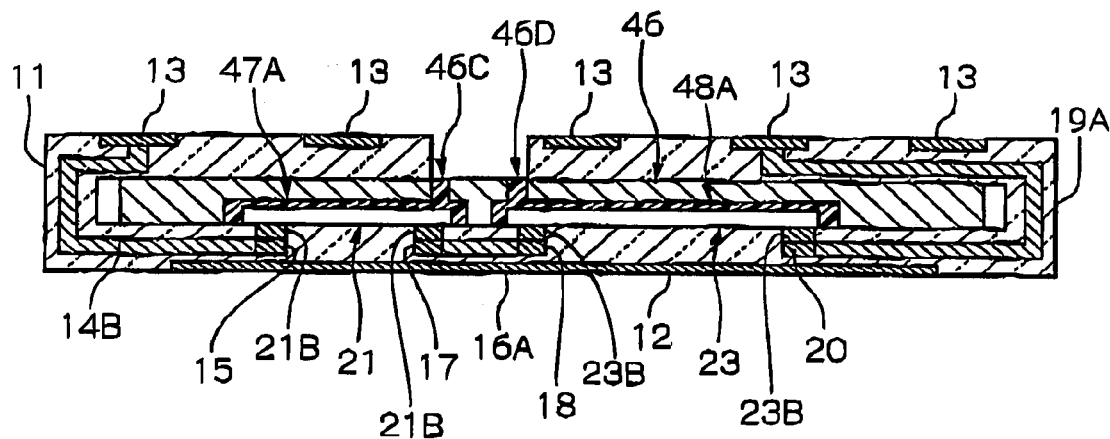

Next, as shown in FIG. 15E, a suitable gel-state resin material such as epoxy resin exhibiting a superior thermal conductivity is introduced into the spaces 47 and 48 (see: FIG. 15D) through the respective through holes 46C and 46D, so that the spaces 47 and 48 are charged with the introduced gel-state resin materials 47A and 48A, respectively, whereby it is possible to establish a superior thermal connection between the common plate-like heat sink 46 and both VCSEL chip 21 and the peripheral IC chip 23 due to the intervention of the gel-state resin materials 47A and 48A.

Note, since it is difficult to precisely process and produce the common plate-like heat sink 46 so that the common plate-like heat sink 46 is in close contact with both VCSEL chip 21 and the peripheral IC chip 23 to thereby establish a superior thermal connection therebetween, it is preferable to use the gel-state resin materials 47A and 48A. Also, note that the viscosity of the gel-state resin materials 47A and 48A is sufficiently large so that they are prevented from being discharged from the through holes 46C and 46D.

Again referring to FIG. 14, after the solder balls 25 are bonded on the electrode pads 13, the optical unit is mounted on the rectangular interposer 26 so that solder balls 25 are bonded on the electrode pads 27 of the rectangular interposer 26. Thereafter, the solder balls 29 are bonded on the electrode pads 28 of the rectangular interposer 26.

In the fifth embodiment of FIG. 14, the common plate-like heat sink 46 may be composed of a suitable material such as copper (Cu), aluminum (Al), copper/tungsten (Cu/W) alloy, aluminum nitride (AlN), diamond (C) or the like.

When the common plate-like heat sink 46 is formed of an electrical conductive material, it may be suitably connected to the ground layer 12 so that the potential of the common plate-like heat sink 46 is maintained at the ground level, whereby the common plate-like heat sink 46 can contribute to elimination of noise from the signal lines 16A.

On the other hand, when the common plate-like heat sink 46 is formed of either an electrical insulating material or a low-conductive material such as aluminum nitride (AlN), the potential of the common plate-like heat sink 46 cannot be maintained at the ground level. Nevertheless, it is possible to easily and advantageously carry out an impedance matching of the signal lines 16A by regulating the electrical conductivity of the common plate-like heat sink 46, resulting in improvement in quality of the high-speed signals.

The gel-state resin materials 47A and 48A may contain either a suitable electrical conductive filler such as silver powder or the like or a suitable non-electrical conductive filler such as alumina powder, silica powder, ceramic powder or the like, to thereby facilitate a thermal radiation from the VCSEL chip 21 and the peripheral IC chip 23. When the gel-state resin materials 47A and 48A contain the electrical conductive filler, and when the common plate-like heat sink 46 is electrically and thermally connected to the ground layer 12, it is possible to further facilitate the thermal radiation from the VCSEL chip 21 and the peripheral IC chip 23.

On the other hand, when the gel-state resin materials 47A and 48A contain the non-electrical conductive filler, it is possible to obtain the thermal radiation without grounding the common plate-like heat sink 46.

Sixth Embodiment

FIG. 16, which corresponds to FIG. 14, shows a sixth embodiment of the optical unit according to the present invention.

The sixth embodiment is substantially the same as the fifth embodiment of FIG. 14 except that the optical unit features individual plate-like heat sinks 49 and 50 for the VCSEL chip 21 and the peripheral IC chip 22, which are provided in the folded flexible transparent sheet 11. Also, in the sixth embodiment, the optical unit may be produced in substantially the same manner as that of FIGS. 15A through 15F.

With reference to FIGS. 17A through 17D, a method for manufacturing the optical unit of FIG. 16 is explained below.

Figure 17A:
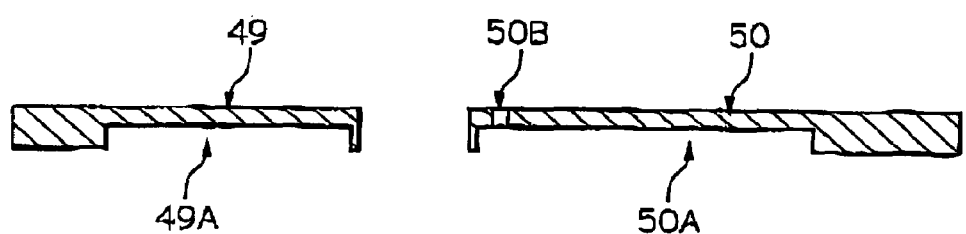
FIGS. 17A through 17D are cross-sectional views for explaining a method for manufacturing the sixth embodiment of FIG. 16.

As shown in FIG. 17A which corresponds to FIG. 15B, the plate-like heat sinks 49 and 50 are prepared after the VCSEL chip 21 and the peripheral IC chip 23 are mounted on the inner surface of the flexible transparent sheet 11 (see: FIG. 15A). Note, although no reference is made to the photodiode chip 22 and the peripheral IC chip 24 for the sake of convenience of explanation, if necessary, the photodiode chip 22 and the peripheral IC chip 24 (see: FIG. 9) may be mounted on the inner surface of the flexible transparent sheet 11.

The plate-like heat sink 49 has a cavity 49A formed in a surface thereof for receiving the VCSEL chip 21. The plate-like heat sink 50 has a cavity formed in a surface thereof, and a through hole 50B formed in the other surface thereof so that the through hole 50B is in communication with the cavity 50A.

Figure 17B:
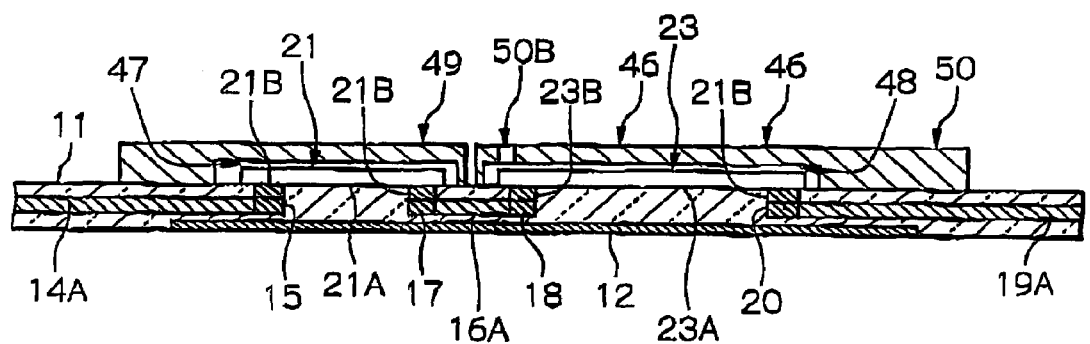

Next, as shown in FIG. 17B which is a cross-sectional view, the plate-like heat sink 49 is mounted on and adhered to the inner surface of the flexible transparent sheet 11 by heating it to about 200° C., so that the VCSEL chip 21 is received in the cavity 49A. The cavity 49A has a larger depth than a thickness of the VCSEL chip 21 so that a space 51 is defined therebetween.

Similarly, the plate-like heat sink 49 is mounted on and adhered to the inner surface of the flexible transparent sheet 11, so that the peripheral IC chip 23 is received in the cavity 50A. The cavity 50A has a larger depth than a thickness of the peripheral IC chip 23 so that a space 52 is defined therebetween.

Figure 17C:
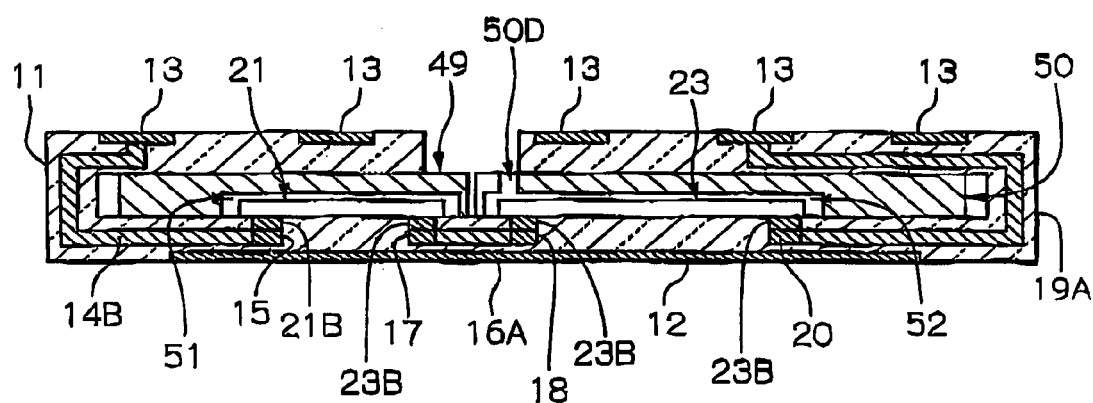

Next, as shown in FIG. 17C, the flexible transparent sheet 11 is folded so that the plate-like heat sinks 49 and 50 are wrapped with the folded flexible transparent sheet 11 in a similar manner to that explained with respect to FIG. 4D, whereby the inner surface of the folded flexible transparent sheet 11 is adhered to the other surfaces of both the plate-like heat sinks 49 and 50. Note that the through hole 50B is not closed by the folded flexible transparent sheet 11.

Figure 17D:
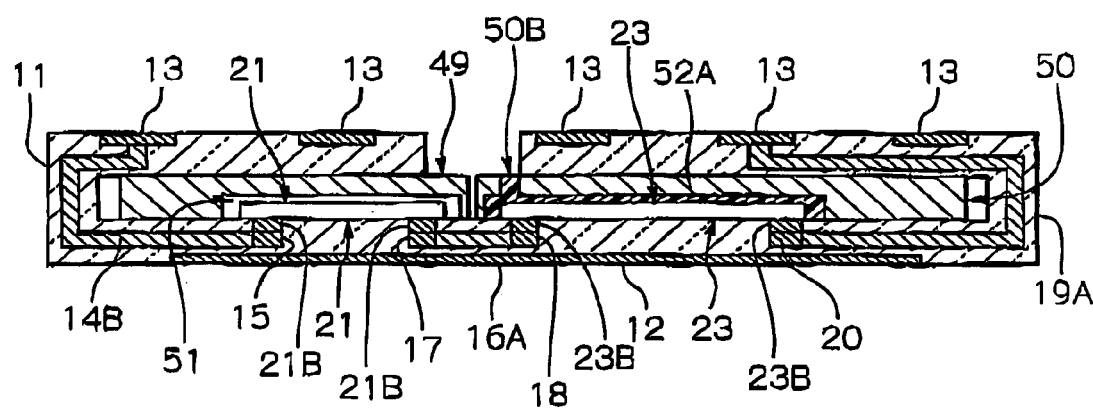

Next, as shown in FIG. 17D, a suitable gel-state resin material such as epoxy resin exhibiting a superior thermal conductivity is introduced into the space 52 (see: FIG. 17C) through the through hole 50B, so that the space 50 is charged with the introduced gel-state resin material 52A, whereby it is possible to establish a superior thermal connection between the plate-like heat sink 50 and the peripheral IC chip 23 due to the intervention of the gel-state resin material 52A. Note, in the six embodiment, the space 51 cannot be charged with a gel-state resin material for the reason stated below.

Again referring to FIG. 16, after the solder balls 25 are bonded on the electrode pads 13, the optical unit is mounted on the rectangular interposer 26 so that solder balls 25 are bonded on the electrode pads 27 of the rectangular interposer 26. Thereafter, the solder balls 29 are bonded on the electrode pads 28 of the rectangular interposer 26.

In the case where the peripheral IC chip 23 generates a larger amount of heat than that in the VCSEL chip 21, the sixth embodiment of FIG. 16 is preferable because the VCSEL chip 21 is thermally isolated by the plate-like heat sink 49 from the plate-like heat sink 50 which may be heated to a higher temperature than that in the plate-like heat sink 49.

Similar to the fifth embodiment of FIG. 14, the plate-like heat sinks 49 and 50 may be composed of a suitable material such as copper (Cu), aluminum (Al), copper/tungsten (Cu/W) alloy, aluminum nitride (AlN), diamond (C) or the like. Also, when both the plate-like heat sinks 49 and 50 are formed of an electrical conductive material, they may be suitably connected to the ground layer 12 so that the potential of the heat sinks 49 and 50 are maintained at the ground level. Further, the gel-state resin materials 47A and 48A may contain either a suitable electrical conductive filler such as silver powder or the like or a suitable non-electrical conductive filler such as alumina powder, silica powder, ceramic powder or the like, to thereby facilitate a thermal radiation from the peripheral IC chip 23.

Seventh Embodiment

Figure 18:
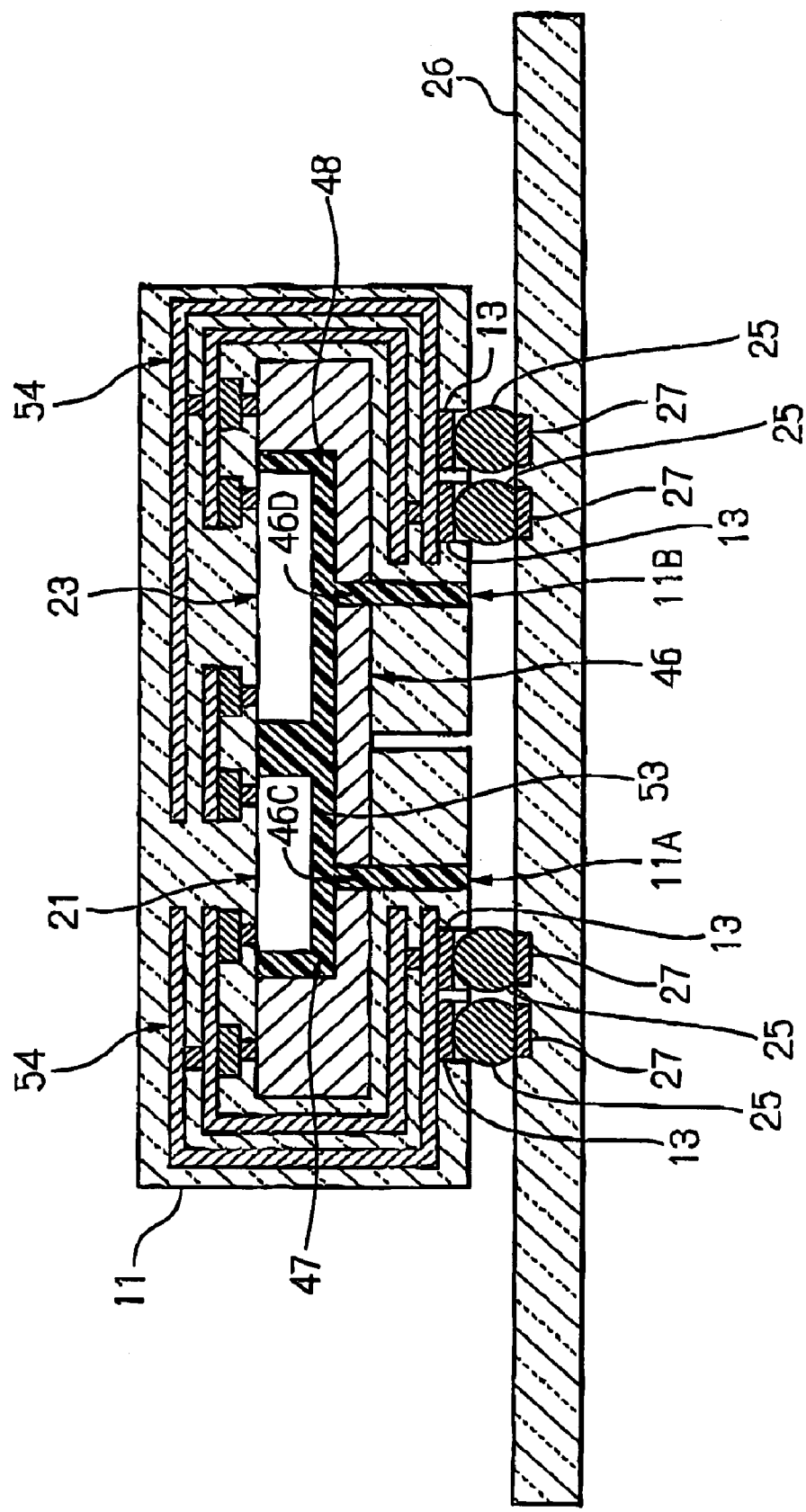
FIG. 18 is a cross-sectional view corresponding to FIG. 14, which shows a seventh embodiment of the optical unit according to the present invention.

FIG. 18, which corresponds to FIG. 14, shows a seventh embodiment of the optical unit according to the present invention. The seventh embodiment is substantially the same as the fifth embodiment of FIG. 14 except for the following matters:

1) The spaces 47 and 48 formed in the common plate-like heat sink 46 are in communication with each other;

2) The through holes 46C and 46D are closed by the folded flexible transparent sheet 11, and otherwise the through holes 46C and 46D are in communication with through holes 11A and 11B formed in the folded flexible transparent sheet 11;

3) The gel-state resin material is introduced into both the spaces 47 and 48 through both the through holes 11A and 36C and both the through holes 11B and 46D, so that both the spaces 47 and 48 are charged with the introduced gel-state resin material 53;

4) The ground layer 12 (see: FIG. 14) is omitted from the flexible sheet 11; and 5) The flexible sheet 11 features a multi-layered interconnection structure, generally indicated by reference numeral 54, which is arranged so that electrical connections are suitably established among the electrode pads 13, the VCSEL chip 21, the peripheral IC chip 23 and the common plate-like heat sink 46.

Note that some of the interconnection layers included in the multi-layered interconnection structure 54 serve as ground lines, which are connected to the ground layer formed in the module substrate 33 (see: FIG. 8).

Eighth Embodiment

Figure 19:
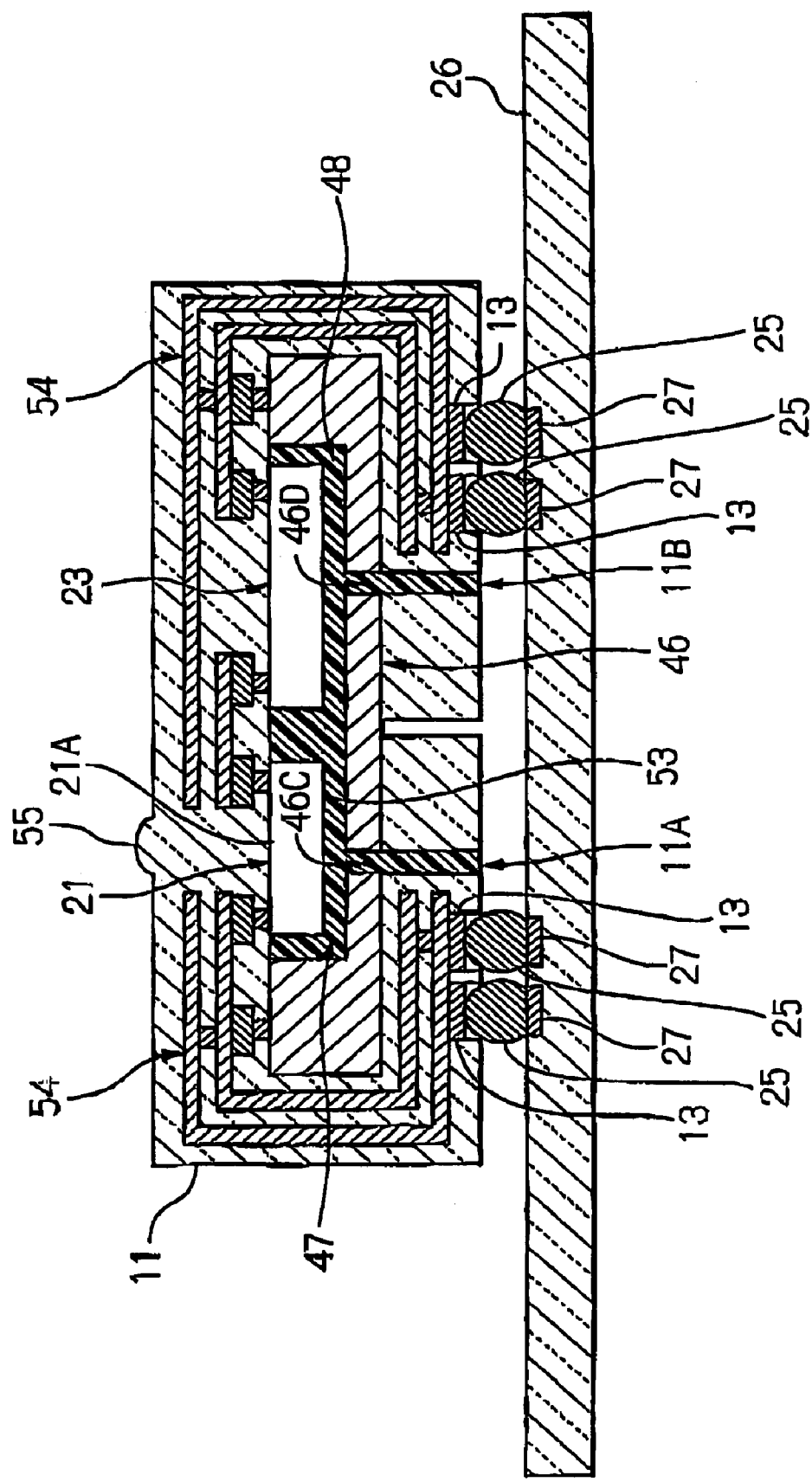
FIG. 19 is a cross-sectional view corresponding to FIG. 18, which shows an eighth embodiment of the optical unit according to the present invention.

FIG. 19, which corresponds to FIG. 18, shows an eighth embodiment of the optical unit according to the present invention. The eighth embodiment is substantially the same as the seventh embodiment of FIG. 18 except that a focus lens 55 is integrally formed on the outer surface of the folded flexible transparent sheet 11 so as to be positioned above the light emitters formed in the circuit formation face 21A of the VCSEL chip 21. Note, in the eighth embodiment, when the optical unit includes the photodiode chip 22 (see: FIG. 9), another focus lens (not shown) is integrally formed on the outer surface of the folded flexible transparent sheet 11 so as to be positioned above the light receivers formed in the circuit formation face of the photodiode chip 22.

Figure 20A:
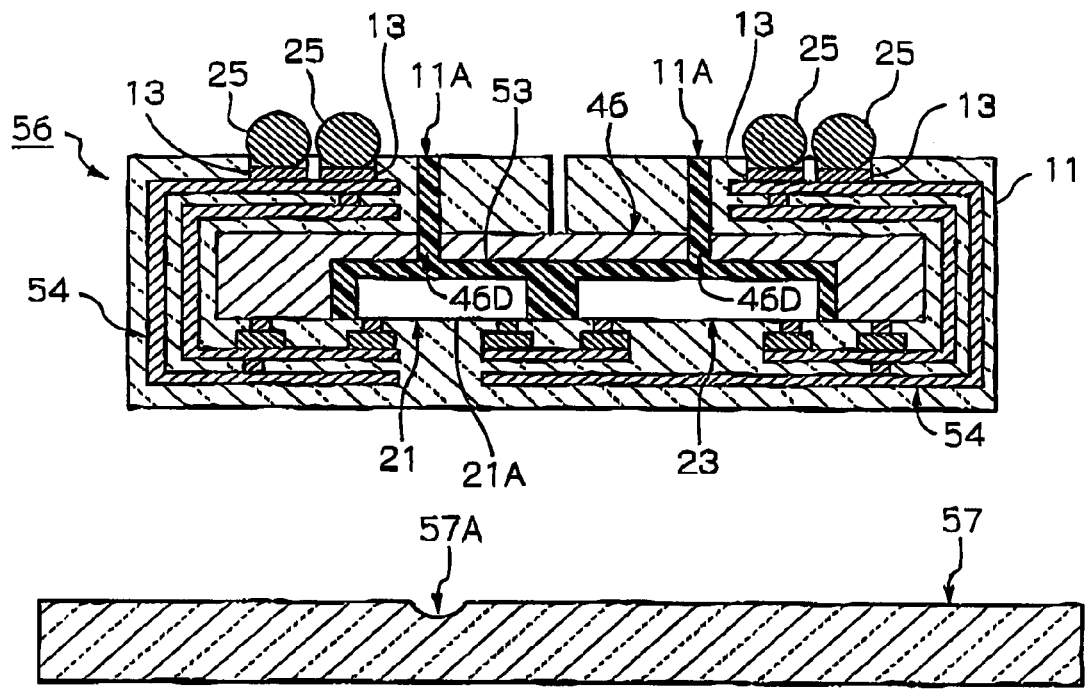
FIGS. 20A and 20B are cross-sectional views for explaining a method for integrally forming a focus lens on a folded flexible transparent sheet of the optical unit of FIG. 19.
Figure 20B:
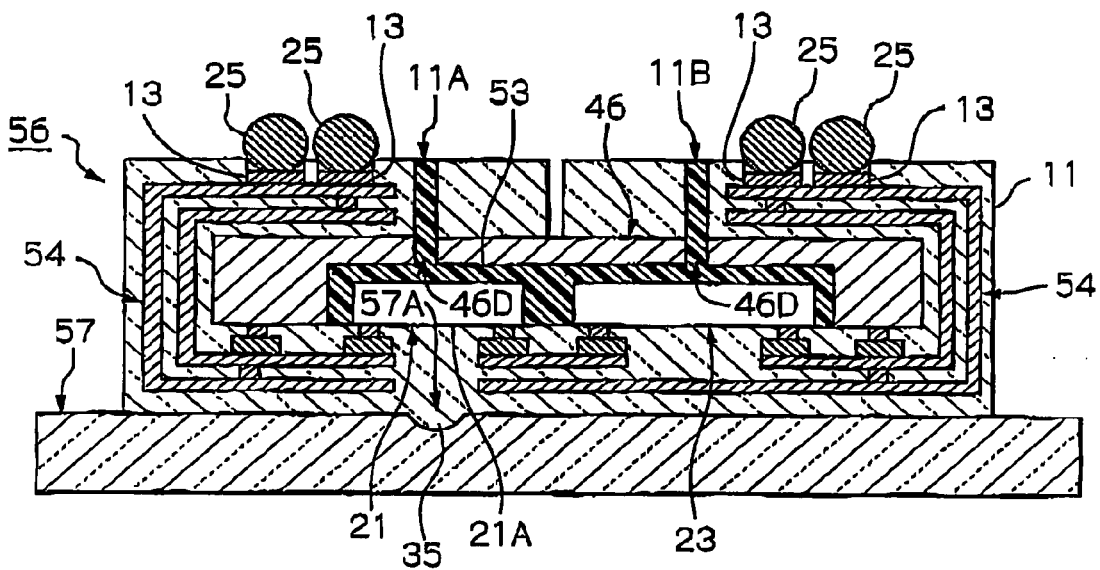

With reference to FIGS. 20A and 20B which are cross-sectional views, a method for integrally forming the focus lens 55 on the folded flexible transparent sheet 11 is explained below.

First, referring to FIG. 20A, the optical unit is generally indicated by reference numeral 56, and a lens mold is indicated by reference numeral 57.

The optical unit 56 corresponds to the optical unit of FIG. 18, the folded flexible transparent sheet 11 of which has no focus lens integrally formed therewith. Also, the folded flexible transparent sheet 11 is composed of polyimide resin exhibiting a transmission factor of at least 80% and a glass transition temperature of about 100° C.

For the formation of the focus lens 55 on the folded flexible transparent sheet 11, a flip-chip bonding machine (not shown) may be utilized. The optical unit 56 is supported by a movable tool of the flip-chip bonding machine, and the lens mold 57 is set on a mount stage of the flip-chip bonding machine. The movable tool is moved downwardly toward the mount stage, and is upwardly moved away from the mount stage. The lens mold 57 has a semi-spherical cavity 57A formed in a top surface thereof, and is set on the mount stage containing an electric heater.

The electric heater contained in the mount stage of the flip-chip bonding machine (not shown) is electrically energized so that the lens mold 57 is heated to more than 100° C. (glass transition temperature). Then, the optical unit 56 supported by the movable tool is positioned with respect to the lens mold 57 so that the light emitters formed in the circuit formation face 21A of the optical unit 56 are aligned with the semi-spherical cavity 57A. Subsequently, the optical unit 56 is moved downwardly toward the lens mold 57 by the movable tool.

Next, as shown in FIG. 20B, the optical unit 56 is pressed against the surface of the lens mold 57 at a pressure falling within the range from 0.1 MPa to 1 MPa over a time period of about 5 seconds, so that the semi-spherical cavity 57A of the lens mold 57 is charged with a part of the thermally softened transparent sheet 11. Then, the optical unit 56 is cooled by an air-cooling apparatus of the flip-chip bonding machine, and the optical unit 56 is removed from the lens mold 57 by moving the movable tool upwardly, resulting in the completion of the formation of the focus lens 55 on the folded flexible transparent sheet 11 of the optical unit 56. According to the eighth embodiment of FIG. 19, by using the optical unit 56, it is possible to more compactly and inexpensively construct an optical module in comparison with the optical module 39 of FIG. 13, because the focus lens 55 is integrally formed on the folded flexible transparent sheet 11.

Figure 21A:
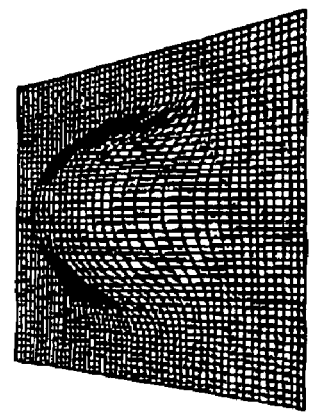
FIGS. 21A, 21B and 21C are 3-dimensional diagrams showing first, second and third types of intensity distributions concerning a laser beam obtained from a vertical cavity surface emitting laser (VCSEL) chip of the optical unit of FIG. 20A.
Figure 21B:
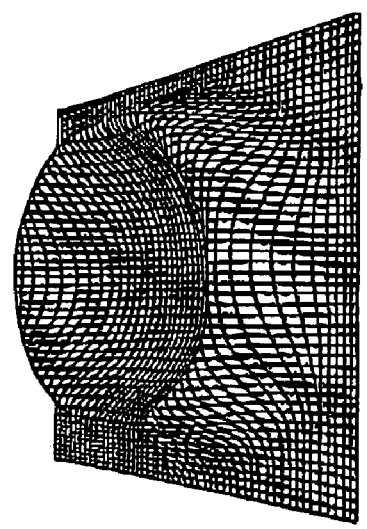
Figure 21C:
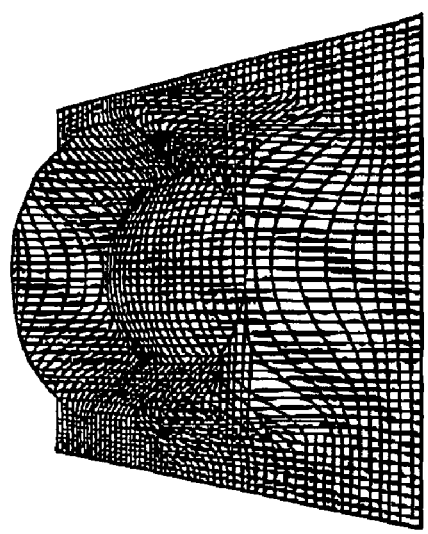

FIGS. 21A, 21B and 21C show first, second and third types of light intensity distributions concerning a laser beam which are obtained from the VCSEL chip 21.

In particular, the first type of light intensity distribution of FIG. 21A is a Gaussian distribution; the second type of light intensity distribution of FIG. 21B is a toroidal distribution; and the third type of light intensity distribution of FIG. 21C is a Gaussian/toroidal distribution which is a combination of a Gaussian distribution and a toroidal distribution.

In these cases, a focus lens to be formed on the folded flexible transparent sheet 11 of FIG. 20A should be configured so as to conform to each of the first, second and third types of light intensity distributions before a proper optical connection can be established between the light emitters of the VCSEL chip 21 and the optical fibers $32B_1$ (see: FIG. 9).

Namely, referring to FIG. 22A which is a partial cross-sectional view of the folded flexible transparent sheet 11 of FIG. 20A, a focus lens, indicated by reference 58A, is formed on the folded flexible transparent sheet 11 so as to conform to the first type of light intensity distribution or Gaussian distribution of FIG. 21A. Thus, when a laser beam emitted from the VCSEL chip 21 features the Gaussian distribution, by using the focus lens 58A, it is possible to establish a proper optical connection between the light emitters of the VCSEL chip 21 and the optical fibers $32B_1$ (see: FIG. 9).

Also, referring to FIG. 22B which is a partial cross-sectional view of the folded flexible transparent sheet 11 of FIG. 20A, a focus lens, indicated by reference 58B, is formed on the folded flexible transparent sheet 11 so as to conform to the second type of light intensity distribution or toroidal distribution of FIG. 21B. Thus, when a laser beam emitted from the VCSEL chip 21 features the toroidal distribution, by using the focus lens 58B, it is possible to establish a proper optical connection the light emitters of the VCSEL chip 21 and the optical fibers $32B_1$ (see: FIG. 9).

Further, referring to FIG. 22C which is a partial cross-sectional view of the folded flexible transparent sheet 11 of FIG. 20A, a focus lens, indicated by reference 58C, is formed on the folded flexible transparent sheet 11 so as to conform to the third type of light intensity distribution or Gaussian/toroidal distribution of FIG. 21C. Thus, when a laser beam emitted from the VCSEL chip 21 features the Gaussian/toroidal distribution, by using the focus lens 58C, it is possible to establish a proper optical connection the light emitters of the VCSEL chip 21 and the optical fibers $32B_1$ (see: FIG. 9).

For example, the lens mold 67 of FIG. 20 may be made as a silicon substrate having a polished surface, and a molding cavity for forming each of the focus lenses 58A, 58B and 58C may be formed by using a focused ion beam (FIB) machine. In general, in the FIB machine, a gallium (Ga) ion beam is used, and exhibits a Gaussian intensity distribution.

Figure 23A:
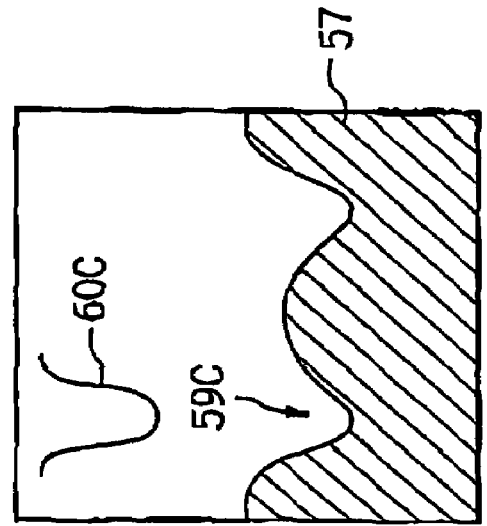
FIG. 23A is a partial cross-sectional view of the lens mold for forming the first focus lens of FIG. 22A.

Referring to FIG. 23A which is a partial cross-sectional view of the lens mold or silicon substrate 57, a molding cavity 59A for forming the focus lens 58A of FIG. 22A is formed in the silicon substrate 57 by etching the polished surface of the silicon substrate 57 with the Ga ion beam projected from the FIB machine. Note, in FIG. 23A, reference 60A indicates the Gaussian intensity distribution of the Ga ion beam concerned.

Figure 23B:
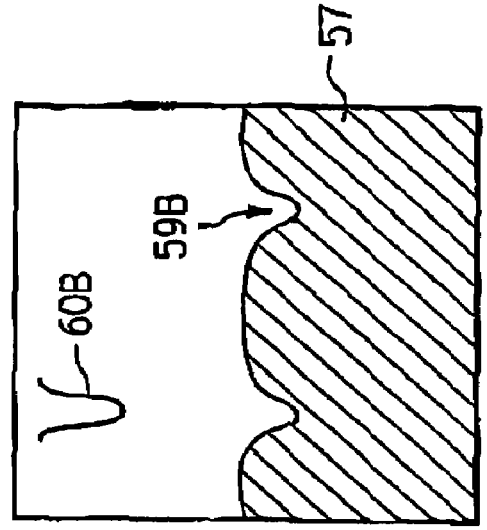
FIG. 23B is a partial cross-sectional view of the lens mold for forming the second focus lens of FIG. 22B.

Also, referring to FIG. 23B which is a partial cross-sectional view of the lens mold or silicon substrate 57, a molding cavity 59B for forming the focus lens 58B of FIG. 22A is formed in the silicon substrate 57 by etching the polished surface of the silicon substrate 57 with the Ga ion beam projected from the FIB machine. Note, in FIG. 23B, reference 60B indicates the Gaussian intensity distribution of the Ga ion beam concerned.

Figure 23C:
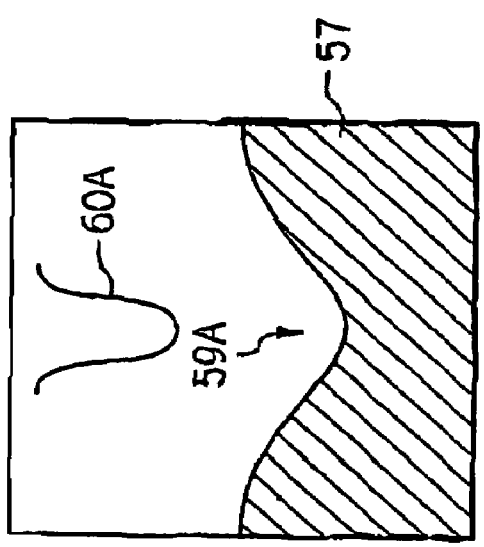
FIG. 23C is a partial cross-sectional view of the lens mold for forming the third focus lens of FIG. 21C.

Further, referring to FIG. 23C which is a partial cross-sectional view of the lens mold or silicon substrate 57, a molding cavity 59C for forming the focus lens 58C of FIG. 22A is formed in the silicon substrate 57 by etching the polished surface of the silicon substrate 57 with the Ga ion beam projected from the FIB machine. Note, in FIG. 23C, reference 60C indicates the Gaussian intensity distribution of the Ga ion beam concerned.

In the eighth embodiment of FIG. 19, when the focus lens 55 has a relatively large thickness, there is a case where the lens 55 cannot be formed as a part of the folded flexible transparent sheet 11.

Figure 24:
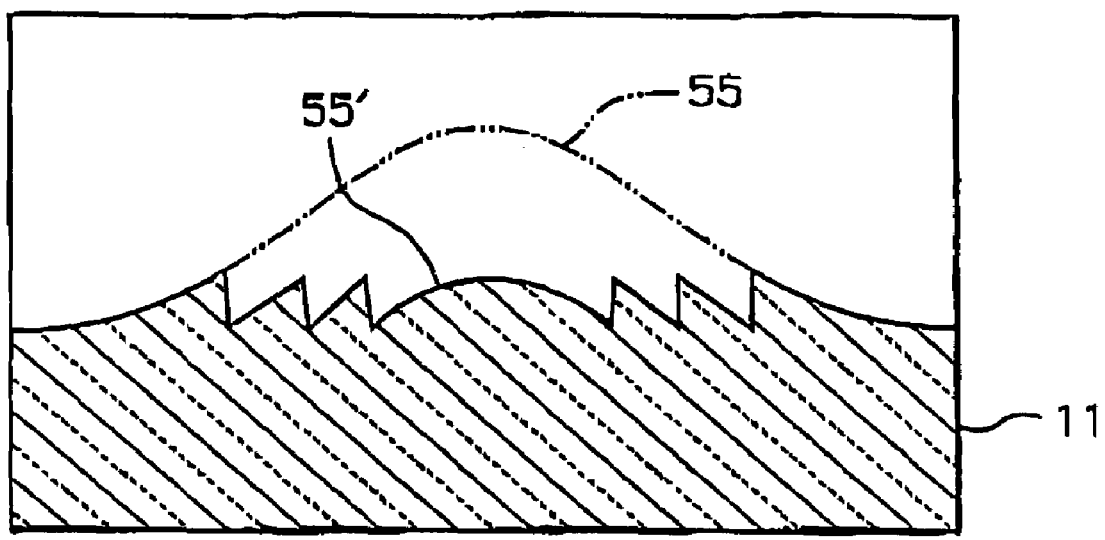
FIG. 24 is a partial cross-sectional view of the folded flexible transparent sheet of the optical unit of FIG. 20A on which a Fresnel lens is formed.

In this case, as shown in FIG. 24 which is a partial cross-sectional view of the folded flexible transparent sheet 11 of FIG. 20B, the focus lens 55 may be formed as a Fresnel lens 55'.

In the above-mentioned embodiments, although the electrical interconnection layers are formed in the flexible transparent sheet 11, they are made on the inner surface and/or the outer surface of the flexible transparent sheet 11.

A flexible sheet, a part of which is formed as a transparent area, may be substituted for the flexible transparent sheet 11. Of course, in this case, the flexible sheet is folded so that the transparent area is positioned above the VCSEL chip 21 and the photodiode chip 22.

Finally, it will be understood by those skilled in the art that the foregoing description is of preferred embodiments of the optical unit and the method, and that various changes and modifications may be made to the present invention without departing from the spirit and scope thereof.

The invention claimed is:

1. An optical unit comprising:
  a photoelectric conversion chip adapted to be optically connected to an optical fiber;
  a semiconductor chip for driving said photoelectric conversion chip; and a flexible sheet with which both said photoelectric conversion chip and said semiconductor chip are wrapped, to thereby produce an enveloper enveloping said photoelectric conversion chip and said semiconductor chip therein;

wherein at least a part of said enveloper is formed as a transparent area for allowing an optical connection between said optical fiber and said photoelectric conversion chip.

2. The optical unit as set forth in claim 1, wherein said flexible sheet has a first group of electrical interconnection layers for establishing an electrical connection between said photoelectric conversion chip and said semiconductor chip, and a second group of electrical interconnection layers adapted to be electrically connected to an external wiring board.

3. The optical unit as set forth in claim 1, said photoelectric conversion chip and said semiconductor chip are configured as plate-like chips, and wherein said plate-like chips are juxtaposed with each other in said enveloper.

4. The optical unit as set forth in claim 1, further comprising a heat sink provided in said enveloper so as to be thermally connected to both said photoelectric conversion chip and said semiconductor chip.

5. The optical unit as set forth in claim 4, wherein said heat sink is formed as an electrically conductive heat sink.

6. The optical unit as set forth in claim 5, wherein said heat sink is grounded.

7. The optical unit as set forth in claim 4, wherein said heat sink is formed as a non-electrically conductive heat sink.

8. The optical unit as set forth in claim 4, wherein said heat sink has first and second cavities formed therein, said photoelectric conversion chip being received in said first cavity so that a first space is defined therebetween, said semiconductor chip being received in said second cavity so that a second space is defined therebetween.

9. The optical unit as set forth in claim 8, wherein said first and second spaces are charged with a gel-state resin having a superior thermal conductivity.

10. The optical unit as set forth in claim 9, wherein said gel-state resin contains an electrically conductive filler.

11. The optical unit as set forth in claim 9, wherein said gel-state resin contains a non-electrically conductive filler.

12. The optical unit as set forth in claim 1, further comprising:

a first heat sink provided in said enveloper and having a cavity in which said photoelectric conversion chip is received so that a first space is defined therebetween; and a second heat sink provided in said enveloper and having a cavity in which said semiconductor chip is received so that a second space is defined therebetween.

13. The optical unit as set forth in claim 12, wherein each of said first and second heat sinks is formed as an electrically conductive heat sink.

14. The optical unit as set forth in claim 13, wherein said first and second heat sinks are grounded.

15. The optical unit as set forth in claim 12, wherein each of said first and second heat sinks is formed as a non-electrically conductive heat sink.

16. The optical unit as set forth in claim 12, wherein at least one of said first and second spaces is charged with a gel-state resin having a superior thermal conductivity.

17. The optical unit as set forth in claim 16, wherein said gel-state resin exhibits an electrical conductivity.

18. The optical unit as set forth in claim 2, wherein the electrical interconnection layers included in said first group are adjacently arrayed, one of said electrical interconnection layers serving as a signal line, another of said electrical interconnection layers serving as a ground line.

19. The optical unit as set forth in claim 1, wherein said enveloper has a focus lens formed at the transparent area thereof for the optical connection between said optical fiber and said photoelectric conversion chip.

20. The optical unit as set forth in claim 19, wherein said focus lens is integrally formed as a part of said enveloper.

* * * * *